US012057430B2

(12) United States Patent
Jo

(10) Patent No.: US 12,057,430 B2
(45) Date of Patent: Aug. 6, 2024

(54) DISPLAY DEVICE INCLUDING CONNECTION PAD PART AND ELECTRONIC COMPONENT CONNECTED TO CONNECTION PAD PART

(71) Applicant: SAMSUNG DISPLAY CO., LTD., Yongin-si (KR)

(72) Inventor: Jungyun Jo, Namyangju-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 39 days.

(21) Appl. No.: 17/436,331

(22) PCT Filed: Aug. 5, 2020

(86) PCT No.: PCT/KR2020/009316
§ 371 (c)(1),
(2) Date: Sep. 3, 2021

(87) PCT Pub. No.: WO2021/060683
PCT Pub. Date: Apr. 1, 2021

(65) Prior Publication Data
US 2022/0216177 A1 Jul. 7, 2022

(30) Foreign Application Priority Data

Sep. 25, 2019 (KR) .................. 10-2019-0118039

(51) Int. Cl.
*H01L 23/00* (2006.01)
*H01L 25/18* (2023.01)
*H10K 59/131* (2023.01)
(52) U.S. Cl.
CPC .............. *H01L 24/83* (2013.01); *H01L 24/05* (2013.01); *H01L 24/32* (2013.01); *H01L 24/33* (2013.01);
(Continued)

(58) Field of Classification Search
CPC ....... H10K 59/131; H01L 24/06; H01L 24/30; H01L 2224/06131; H01L 2224/06135; (Continued)

(56) References Cited

U.S. PATENT DOCUMENTS 10,038,044 B2 7/2018 Shin
10,191,057 B2 1/2019 Pollack et al.
10,510,821 B2 12/2019 Jo et al.
10,515,881 B2 12/2019 Kim et al.
(Continued)

FOREIGN PATENT DOCUMENTS

KR 10-2017-0123387 11/2017
KR 10-2017-0140764 12/2017
(Continued)

*Primary Examiner* — Lex H Malsawma
*Assistant Examiner* — Laura M Dykes
(74) *Attorney, Agent, or Firm* — F. Chau & Associates, LLC

(57) ABSTRACT

A display device includes a display substrate, a signal pad part, an insulating layer, a connection pad part, and an electronic component. The signal pad part includes first and second signal pad parts, which face each other in one direction. The insulating layer covers the signal pad part. The connection pad part is disposed on the insulating layer and includes a first connection pad part overlapping the first signal pad part and a second connection pad part. The second connection pad part is electrically connected to the first connection pad part and is in electrical contact with the second signal pad part through a contact hole defined in the insulating layer. The electronic component includes a bump that is in electrical contact with the first connection pad part. The first signal pad part includes a plurality of signal pad portions spaced apart from each other.

15 Claims, 22 Drawing Sheets

(52) U.S. Cl.
CPC ............ *H01L 25/18* (2013.01); *H10K 59/131* (2023.02); *H01L 24/06* (2013.01); *H01L 24/29* (2013.01); *H01L 24/30* (2013.01); *H01L 2224/04026* (2013.01); *H01L 2224/05073* (2013.01); *H01L 2224/05558* (2013.01); *H01L 2224/05562* (2013.01); *H01L 2224/05573* (2013.01); *H01L 2224/06131* (2013.01); *H01L 2224/06135* (2013.01); *H01L 2224/29013* (2013.01); *H01L 2224/30131* (2013.01); *H01L 2224/32014* (2013.01); *H01L 2224/32105* (2013.01); *H01L 2224/32145* (2013.01); *H01L 2224/3303* (2013.01); *H01L 2224/33106* (2013.01); *H01L 2224/33517* (2013.01); *H01L 2224/83205* (2013.01); *H01L 2224/83862* (2013.01)

(58) Field of Classification Search
CPC ............. H01L 2224/32105; H01L 2224/3303; H01L 2224/05557; H01L 2224/13027
USPC .......................................................... 257/91
See application file for complete search history.

(56) References Cited

U.S. PATENT DOCUMENTS

| | | | |
|---|---|---|---|
| 10,892,313 B2 | 1/2021 | Kim et al. | |
| 2005/0052442 A1* | 3/2005 | Takenaka | G02F 1/13452 345/204 |
| 2008/0049171 A1* | 2/2008 | Takahashi | G02F 1/13452 257/737 |
| 2009/0121349 A1* | 5/2009 | Suzuki | G02F 1/13458 257/737 |
| 2017/0358642 A1* | 12/2017 | Jo | H10K 59/131 |

FOREIGN PATENT DOCUMENTS

| | | |
|---|---|---|
| KR | 10-2018-0070774 | 6/2018 |
| KR | 10-2019-0098878 | 8/2019 |

* cited by examiner

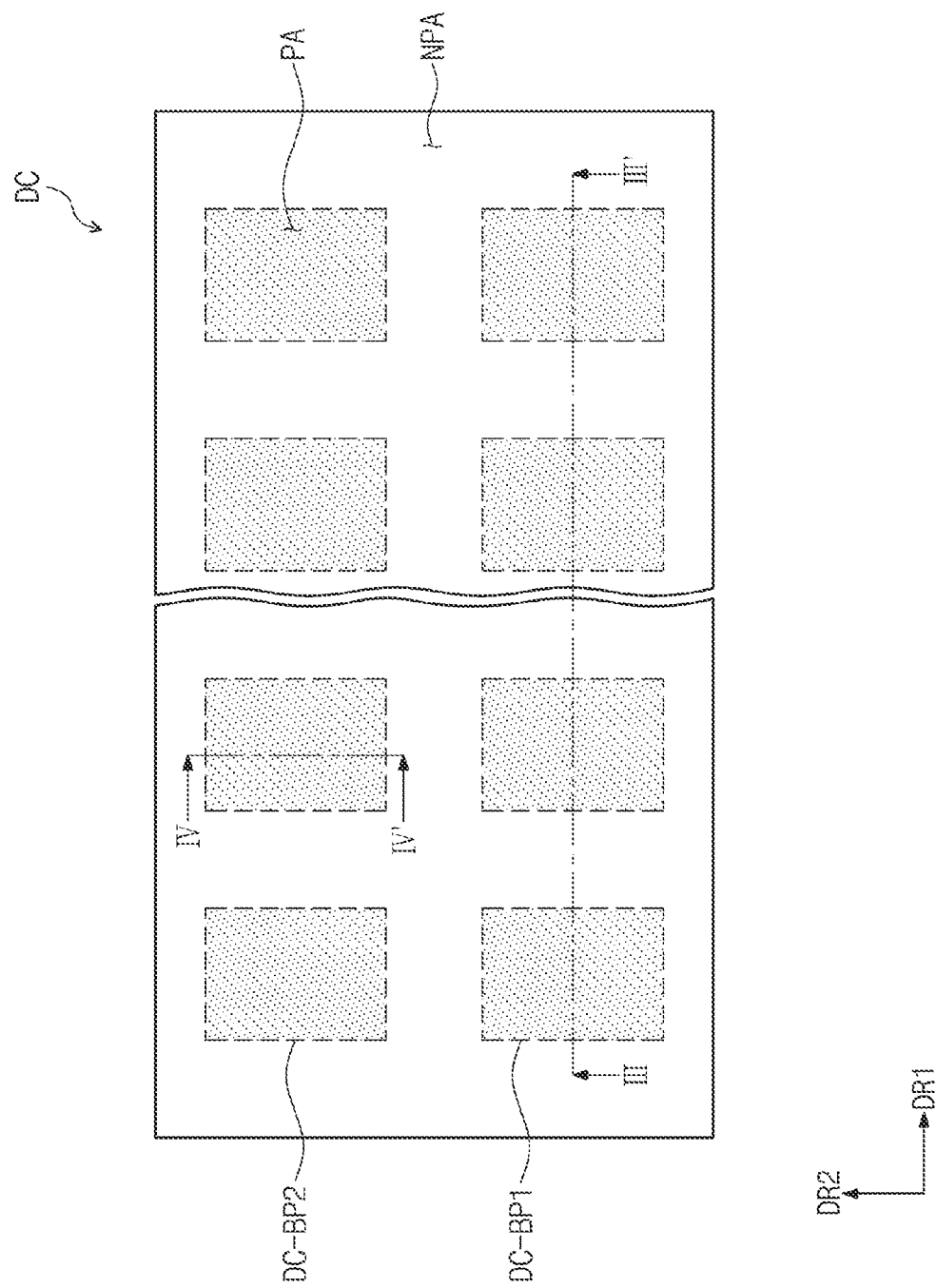

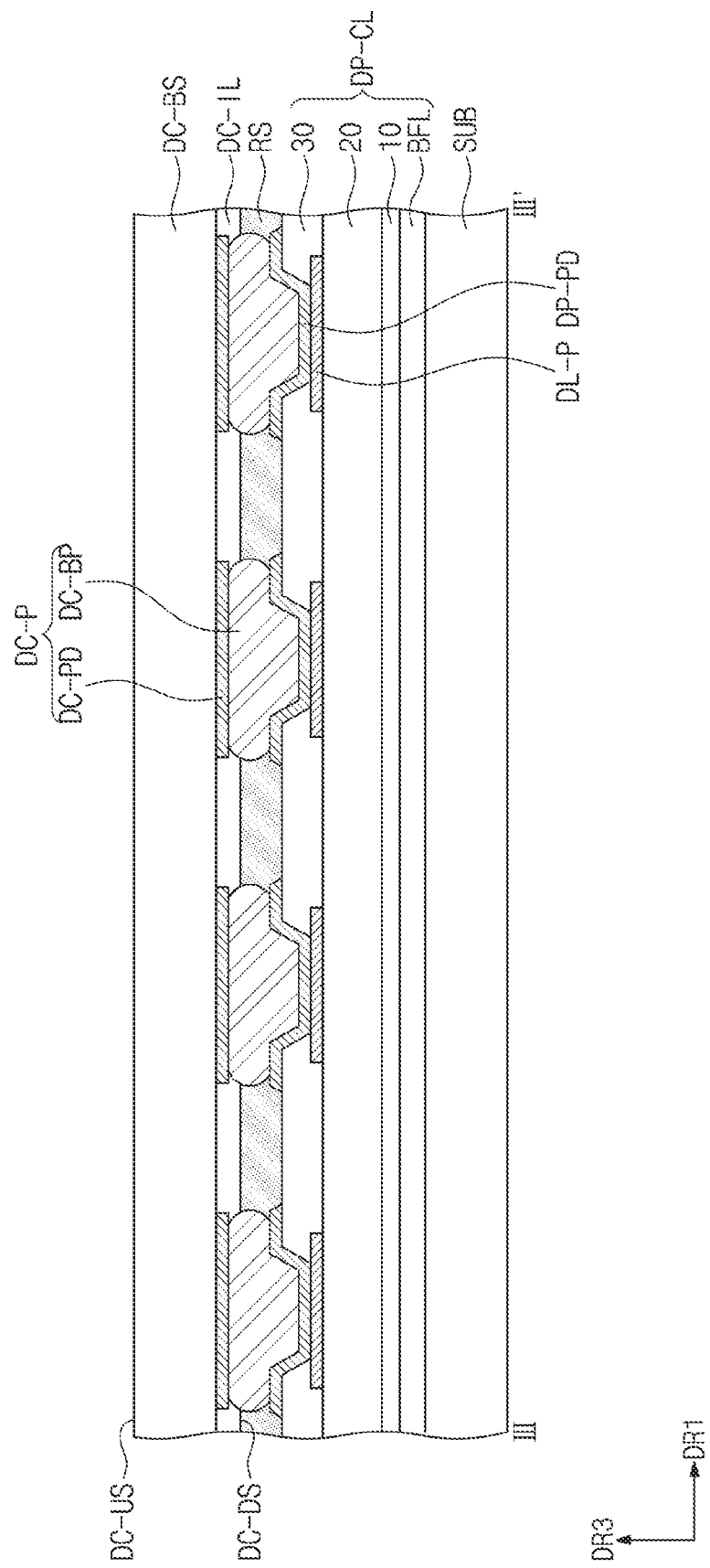

DISPLAY DEVICE INCLUDING CONNECTION PAD PART AND ELECTRONIC COMPONENT CONNECTED TO CONNECTION PAD PART

CROSS-REFERENCE TO RELATED APPLICATIONS

The present application is a National Stage application, filed under 35 U.S.C. § 371, of International Patent Application No. PCT/KR2020/009316, filed on Aug. 5, 2020, which claims priority to Korean Patent Application No. KR 10-2019-0118039, filed on Sep. 25, 2019, the contents of which are incorporated by reference herein in their entirety.

TECHNICAL FIELD

The present invention relates to a display device, and more particularly, to a display device and a method for manufacturing the same.

DISCUSSION OF RELATED ART

Various display devices used in multimedia equipment such as televisions, mobile phones, tablet computers, navigation devices, and game consoles are being developed.

Such a display device includes a display panel on which an image is displayed. The display panel includes a plurality of gate lines, a plurality of data lines, and a plurality of pixels connected to the plurality of gate lines and the plurality of data lines. The display device may be connected to an electronic component that provides an electrical signal required for displaying an image to the gate lines or the data lines.

The electronic component may be electrically connected to the display panel by using an anisotropic conductive film or ultrasonography bonding. Among them, in the connection method between the display panel and the electronic component using the ultrasonography bonding, conductivity may increase more compared to the anisotropic conductive film and thus may be simplified in process.

SUMMARY

An object of the present invention is to provide a display device, which is capable of improving connection reliability between an electronic component and a display panel, and a method for manufacturing the same.

A display device according to an embodiment for achieving an object of the present invention includes a display substrate on which a display area and a non-display area adjacent to the display area are defined, a signal pad part that overlaps the non-display area and includes a first signal pad part and a second signal pad part, which faces the first signal pad part in one direction and is spaced apart from the first signal pad part on a plane, an insulating layer configured to cover the signal pad part and disposed on the display substrate, a connection pad part that is disposed on the insulating layer and includes a first connection pad part configured to overlap the first signal pad part and a second connection pad part, which is electrically connected to the first connection pad part and is in electrical contact with the second signal pad part through a contact hole defined in the insulating layer, and an electronic component including a bump that is in electrical contact with the first connection pad part, wherein the first signal pad part includes a plurality of signal pad portions spaced apart from each other on the plane.

According to an embodiment of the present invention, the display device further includes a filler disposed between the electronic component and the connection pad part.

According to an embodiment of the present invention, the first connection pad part includes first portions and second portions, which are alternately and repeatedly disposed along the one direction, and each of the first portion is in contact with the bump, and each of the second portion is not in contact with the bump.

According to an embodiment of the present invention, the first portions of the first connection pad parts overlap the signal pad portions, respectively, and the second portions of the first connection pad part do not overlap the first signal pad part.

According to an embodiment of the present invention, the filler is disposed in an inner space defined by the first portion, the second portion, and the bump, and the inner space is connected to a space between the electronic component and the first connection pad part, which do not overlap the bump.

According to an embodiment of the present invention, the filler overlaps the insulating layer.

According to an embodiment of the present invention, the signal pad portions are arranged in the one direction, and each of the signal pad portions extends in a different direction that is perpendicular to the one direction.

According to an embodiment of the present invention, only one of the signal pad portions directly faces the second signal pad part in the one direction.

According to an embodiment of the present invention, the signal pad part further includes a third signal pad part that is electrically connected to the signal pad portions and the second signal pad part, the third signal pad part includes first sub pad portions disposed between the signal pad portions and a second sub pad portion configured to connect any one of the signal pad portions to the second signal pad part, and the first signal pad part and the third signal pad part are provided in an integrated shape.

According to an embodiment of the present invention, each of the signal pad portions extends in the one direction, and the signal pad portions are arranged in a different direction that is perpendicular to the one direction.

According to an embodiment of the present invention, each of the signal pad portions faces the second signal pad part in the one direction.

According to an embodiment of the present invention, the first signal pad part and the second signal pad part are electrically insulated from each other.

According to an embodiment of the present invention, the insulating layer includes a plurality of sub insulating layers, the contact hole passes through the sub insulating layers, and the second connection pad part is in electrical contact with the second signal pad part through the contact hole.

According to an embodiment of the present invention, the contact hole does not overlap the first connection pad part on the plane.

According to an embodiment of the present invention, the bump includes a first bump portion configured to overlap the first connection pad part and a second bump portion that does not overlap the first connection pad part, and the second bump portion is in contact with a portion of the insulating layer.

According to an embodiment of the present invention, a planar area of the second bump portion is 10% to 50% of a total planar area of the bump.

A method for manufacturing a display device according to another embodiment for achieving an object of the present invention includes providing a display substrate, on which a pad part including a first pad part and a second pad part is disposed, an electronic component including a bump facing the first pad part of the pad part, and a filler between the pad part and the electronic component, allowing the bump to be in contact with the first pad part by applying a pressure to the electronic component while applying heat to the filler, and applying ultrasonic vibration to the bump and the first pad part, wherein the first pad part includes a first portion and a second portion, which are alternately and repeatedly disposed in one direction, and the first portion is in contact with the bump, and the second portion is not in contact with the bump.

According to an embodiment of the present invention, viscosity of the filler decreases during a first period for which a temperature of the filler increases through the heat from a first reference point to a second reference point, and the filler is cured during a second period for which the temperature of the filler increases above the second reference point.

According to an embodiment of the present invention, during the first period, the bump is in contact with the first portion.

According to an embodiment of the present invention, as the bump is in contact with the first portion, the filler between the bump and the first portion moves to an inner space between the second portion and the bump, and during the first period, the filler disposed in the inner space moves to an outer space that does not overlap the bump.

According to an embodiment of the present invention, the applying of the ultrasonic vibration proceeds during at least one period of the first period.

According to an embodiment of the present invention, the pad part is disposed on the display substrate, includes a signal pad part that includes a first signal pad part and a second signal pad part, which faces the first signal pad part in the one direction and is spaced apart from the first signal pad part on a plane and a connection pad part that covers and the signal pad part and is disposed on an insulating layer disposed on the display substrate, wherein the connection pad part includes a first connection pad part corresponding to the first pad part and overlapping the first signal pad part and a second connection pad part corresponding to the second pad part and being in electrical contact with the second signal pad part through a contact hole defined in the insulating layer.

According to an embodiment of the present invention, the bump of the electronic component and the connection pad part of the substrate may be electrically connected to each other through the ultrasonography bonding manner. As a result, the electrical connection characteristics between the bump and the connection pad part may be improved.

In addition, according to the present invention, while performing the ultrasonography bonding process between the bump and the connection pad part, the curing of the filler disposed between the bump and the connection pad part may be performed. As a result, the overall processing time of the display device may be shortened.

BRIEF DESCRIPTION OF THE DRAWINGS

FIG. 8 is a plan view of an electronic component according to an embodiment of the present invention.

FIG. 9a is a cross-sectional view taken along line III-III' of FIG. 8.

DETAILED DESCRIPTION OF THE EMBODIMENTS

Figure 1A:
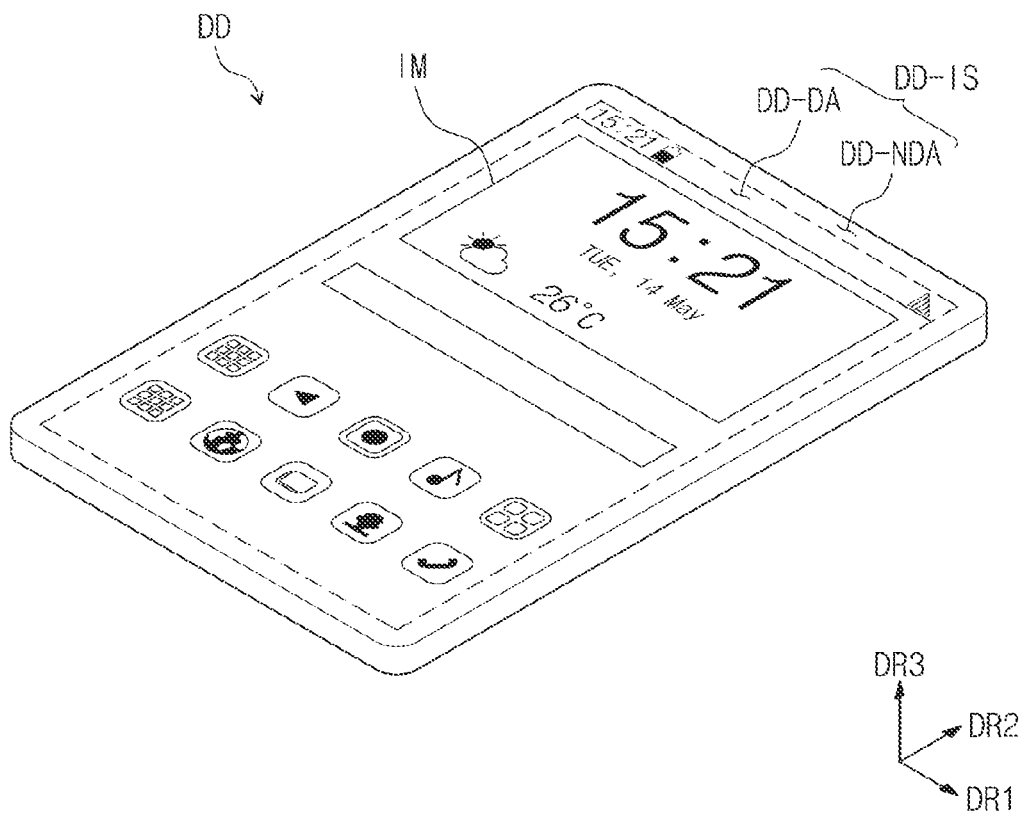
FIG. 1a is a perspective view of a display device according to an embodiment of the present invention.

In this specification, it will be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. For example, a first element referred to as a first element in an embodiment can be referred to as a second element in another embodiment without departing from the scope of the appended claims. The terms of a singular form may include plural forms unless referred to the contrary.

Also, "under", "below", "above', "upper", and the like are used for explaining relation association of components illustrated in the drawings. The terms may be a relative concept and described based on directions expressed in the drawings.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the present invention will be described with reference to the accompanying drawings.

Figure 1B:
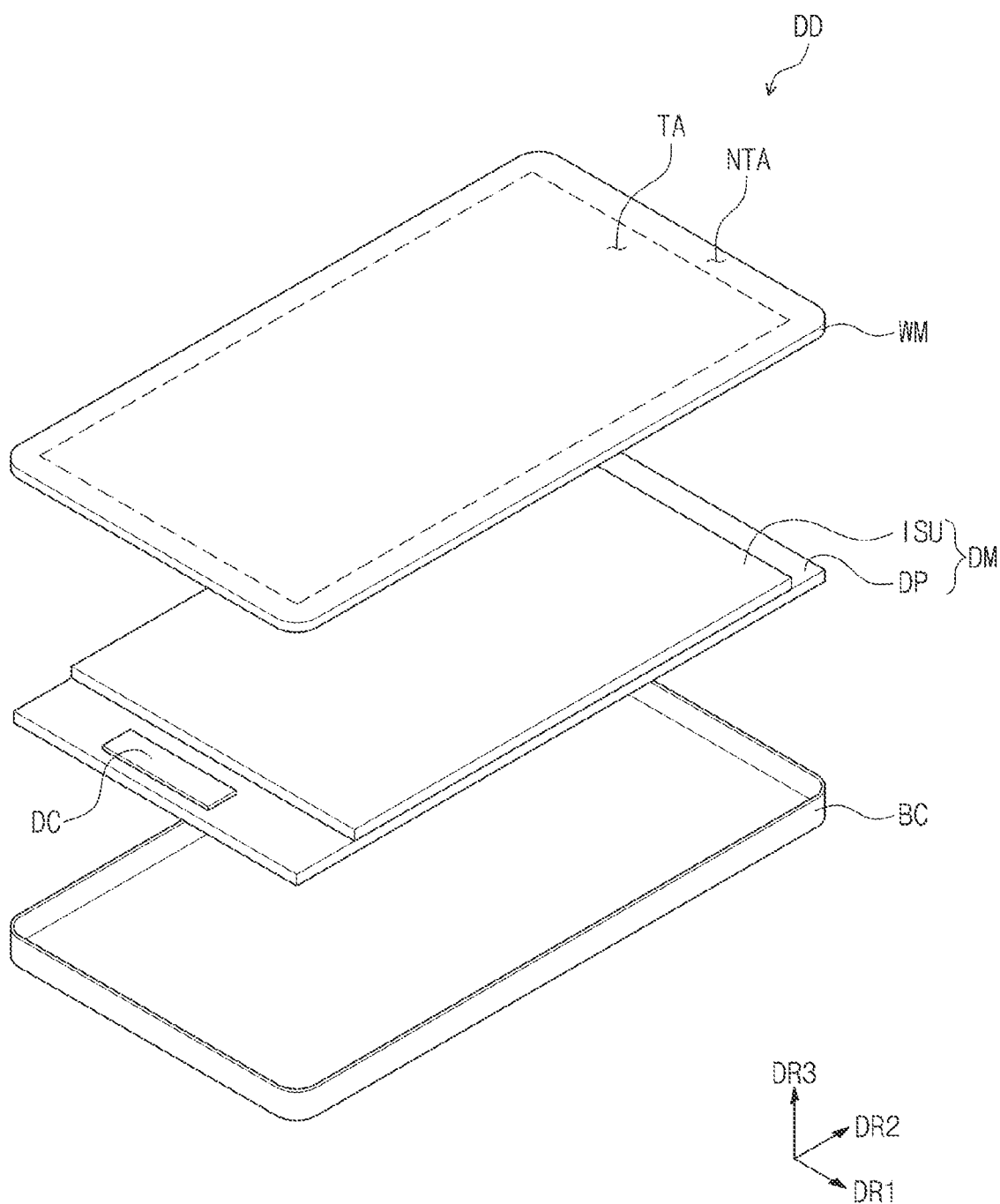
FIG. 1b is an exploded perspective view of the display device according to an embodiment of the present invention.
Figure 2:
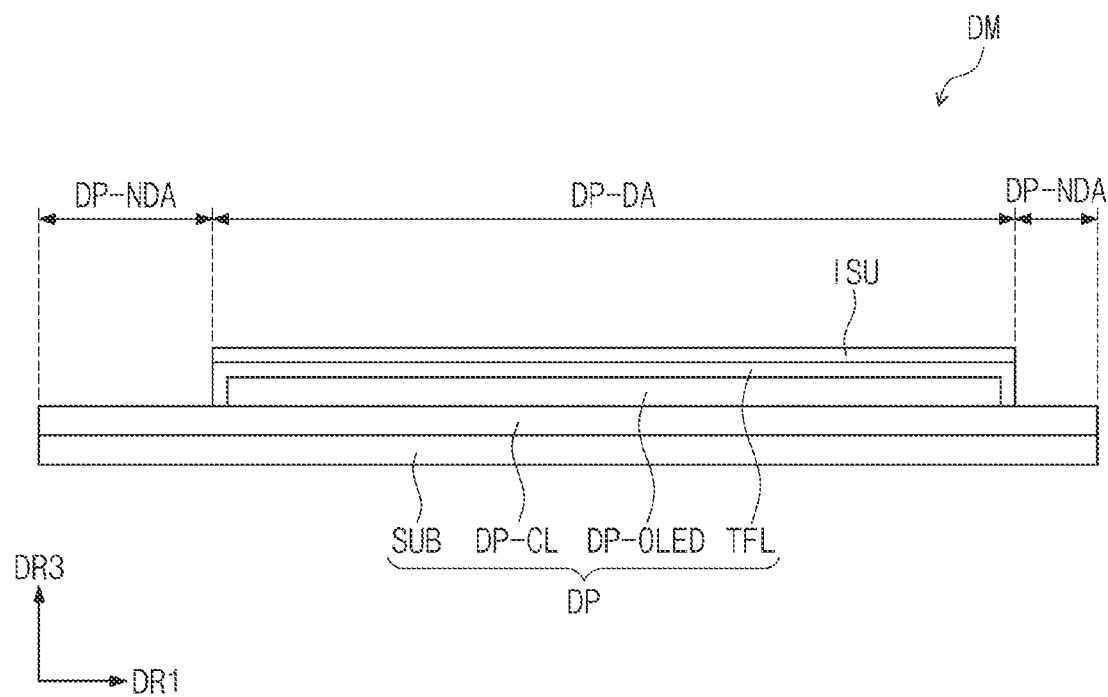
FIG. 2 is a cross-sectional view of a display module according to an embodiment of the present invention.

FIG. 1a is a perspective view of a display device according to an embodiment of the present invention. FIG. 1b is an exploded perspective view of the display device according to an embodiment of the present invention. FIG. 2 is a cross-sectional view of a display module according to an embodiment of the present invention.

In this specification, a display device DD that is capable of being applied to a mobile terminal is exemplarily illustrated. Although not shown, electronic modules, a camera module, a power module, and the like, which are mounted on a main board, may be disposed on a bracket/case together with the display device DD to constitute the mobile terminal. The display apparatus DD according to an embodiment of the present invention may be applied to large-sized electronic apparatuses such as televisions and monitors and small and middle-sized electronic apparatuses such as a tablet PC, navigation units for vehicles, game consoles, and smart watches.

Referring to FIG. 1a, a display device DD may display an image IM through a display surface DD-IS. Icon images as an example of the image IM are illustrated in FIG. 1a. The display surface DD-IS is parallel to a surface defined by a first direction DR1 and a second direction DR2. A normal direction of the display surface DD-IS, i.e., a thickness direction of the display device DD is indicated as a third direction DR3. In this specification, "when viewed on a plane or on the plane" may mean a case when viewed in the third direction DR3. A front surface (or a top surface) and a rear surface (or a bottom surface) of each of layers or units, which will be described below, are distinguished by the third direction DR3. However, directions indicated as the first to third directions DR1, DR2, and DR3 may be changed into different directions, for example, opposite directions as a relative concept.

Also, the display surface DD-IS includes a display area DD-DA on which an image IM is displayed and a non-display area DD-NDA that is adjacent to the display area DD-DA. The non-display area DD-NDA may be an area on which an image is not displayed. However, the embodiment of the present invention is not limited thereto. The non-display area DD-NDA may be adjacent to one side of the display area DD-DA or be omitted.

Referring to FIG. 1b, the display device DD may include a window WM, a display module DM, an electronic component DC, and an accommodation member BC. The accommodation member BC may accommodate the display module DM and be coupled to the window WM.

The window WM may be disposed above the display module DM and can transmit an image provided from the display module DM to the outside. The window WM includes a transmission area TA and a non-transmission area NTA. The transmission area TA overlaps with the display area DD-DA and may have a shape corresponding to the display area DD-DA. The image IM displayed on the display area DD-DA of the display device DD may be visible through the transmission area TA of the window WM from the outside.

The non-transmission area NTA overlaps with the non-display area DD-NDA and may have a shape corresponding to the non-display area DD-NDA. The non-transmission area NTA may be an area having a light transmittance that is relatively less than that of the transmission area TA. However, the technical idea of the present disclosure is not limited thereto, and the non-transmission area NTA may be omitted.

The window WM may be made of glass, sapphire, or plastic. Also, although the window WM is provided as a single layer, the window WM may include a plurality of layers. The window WM may include a base layer and at least one printed layer overlapping the non-transmission area NTA and disposed on a rear surface of the base layer. The printed layer may have a predetermined color. For example, the printed layer may have a black color or have other colors except for the black color.

The display module DM is disposed between the window WM and the accommodation member BC. The display module DM includes a display panel DP and an input sensing layer ISU. The display panel DP generates an image and may transmit the generated image to the window WM.

According to an embodiment of the present invention, the display panel DP may be an emission type display panel, but is not limited thereto. For example, the display panel DP may be an organic light emitting display panel or a quantum-dot light emitting display panel. A light emitting layer of the organic light emitting display panel may include an organic light emitting material. A light emitting layer of the quantum dot light emitting display panel may include a quantum dot, a quantum rod, and the like. Hereinafter, the organic light emitting display panel will be described as an example of the display panel DP.

Hereinafter, a case in which the display panel DP according to the present invention is the organic light emitting display panel will be described. However, the technical idea of the present disclosure is not limited thereto, and various display panels may be applied to the present disclosure according to embodiments.

Referring to FIG. 2, the display panel DP includes a substrate SUB, a circuit element layer DP-CL disposed on the substrate SUB, a display element layer DP-OLED, and an insulating layer TFL.

The display panel DP includes a display area DP-DA and a non-display area DP-NDA. The display area DP-DA of the display panel DP corresponds to the display area DD-DA of FIG. 1a or the transmission area TA of FIG. 1b, and the non-display area DP-NDA corresponds to the non-display area DD-NDA of FIG. 1a or the non-transmission area NTA of FIG. 1b.

The substrate SUB may include at least one plastic film. The substrate SUB may include a plastic substrate, a glass substrate, a metal substrate, or an organic/inorganic composite substrate as a flexible substrate.

The circuit element layer DP-CL includes at least one intermediate insulating layer and a circuit element. The intermediate insulating layer includes at least one intermediate inorganic film and at least one intermediate organic film. The circuit element includes signal lines, a driving circuit of a pixel, and the like.

The display element layer DP-OLED may include a plurality of organic light emitting diodes. The display element layer DP-OLED may further include an organic layer such as a pixel defining layer. According to another embodiment, when the display panel is provided as a liquid crystal display panel, the display element layer may be provided as a liquid crystal layer.

The insulating layer TFL seals the display element layer DP-OLED. For example, the insulating layer TFL may be a thin film encapsulation layer. The insulating layer TFL protects the display element layer DP-OLED against foreign substances such as moisture, oxygen, and dust particles. However, the embodiment of the present invention is not limited thereto. For example, an encapsulation substrate may be provided instead of the insulating layer TFL. In this case, the encapsulation substrate may be opposite to the substrate SUB, and the circuit element layer DP-CL and the display element layer DP-OLED may be disposed between the encapsulation substrate and the substrate SUB.

The input sensing layer ISU may be disposed between the window WM and the display panel DP. The input sensing layer ISU senses an input applied from the outside. The input applied from the outside may be provided in various manners. For example, the external input includes various types of external inputs such as a portion of a user's body, a stylus pen, light, heat, a pressure, or the like. Also, an input through contact with a portion of the human body such as a user's hands, as well as adjacent or neighboring space touches (for example, hovering), may also be one form of the input.

The input sensing layer ISU may be directly disposed on the display panel DP. In this specification, that "a constituent A is directly disposed on a constituent B" may mean that an adhesive member is not disposed between the constituents A and B. In the present embodiment, the input sensing layer ISU may be manufactured together with the display panel DP through a continuous process. However, the technical idea of the present disclosure is not limited thereto. For example, the input sensing layer ISU may be provided as an individual panel and then be coupled to the display panel DP through an adhesive layer. For another example, the input sensing layer ISU may be omitted.

Referring again to FIG. 1b, the electronic component DC may overlap the non-display area DP-NDA and be disposed on the display panel DP. According to the present invention, the electronic component DC may be a driving chip that transfers a driving signal to the display panel DP. For example, the electronic component DC may generate a driving signal that is required for the operation of the display panel DP on the basis of the control signal transmitted from the outside. The electronic component DC may transmit the generated driving signal to the circuit element layer DP-CL of the display panel DP.

According to an embodiment of the present invention, the electronic component DC may be electrically connected to the display panel DP in an ultrasonography bonding manner. For example, a bump included in the electronic component DC and a pad included in the display panel DP may be in contact with each other in the ultrasonography bonding manner.

Figure 3:
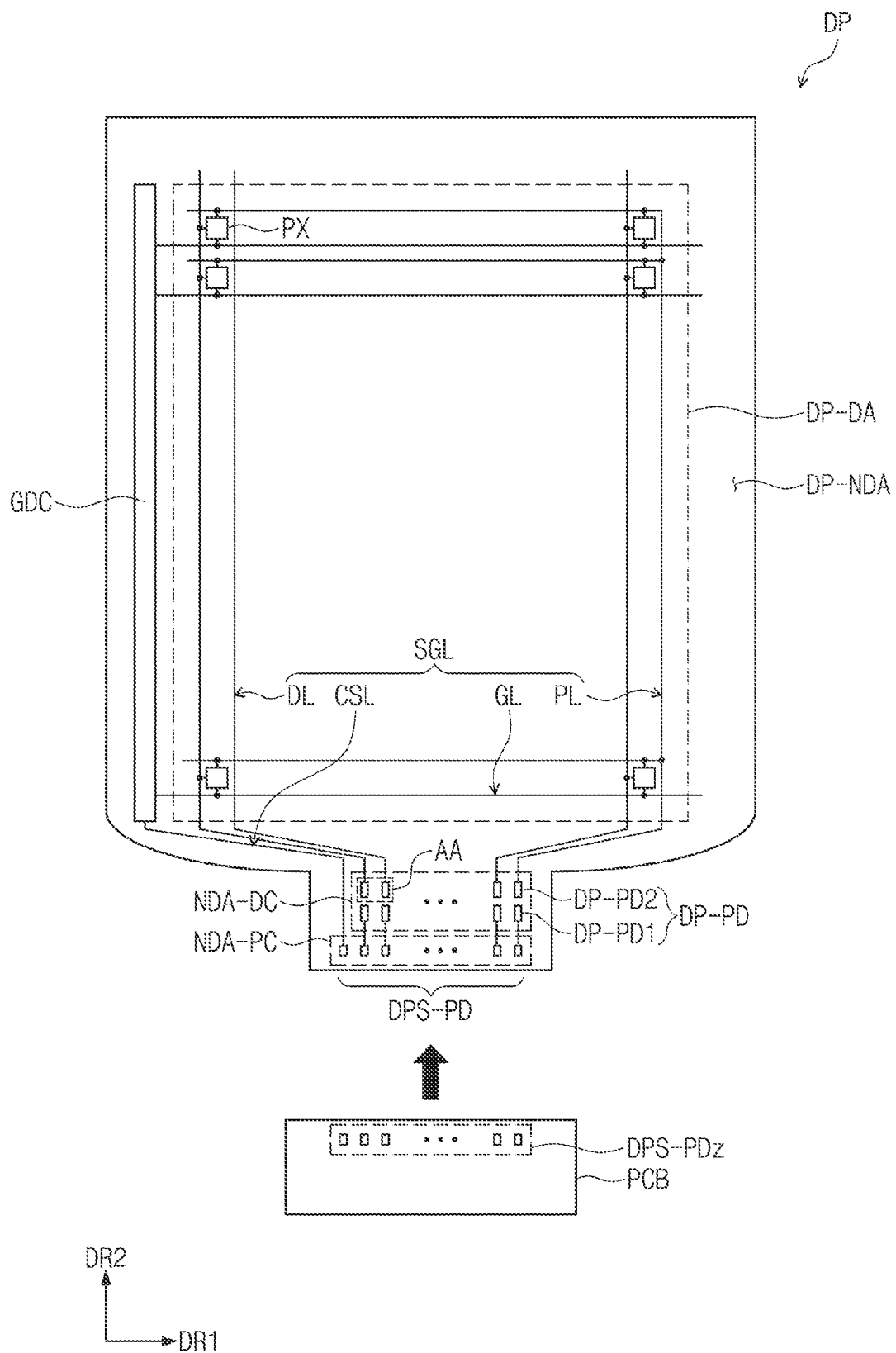
FIG. 3 is a plan view of a display panel according to an embodiment of the present invention.
Figure 4A:
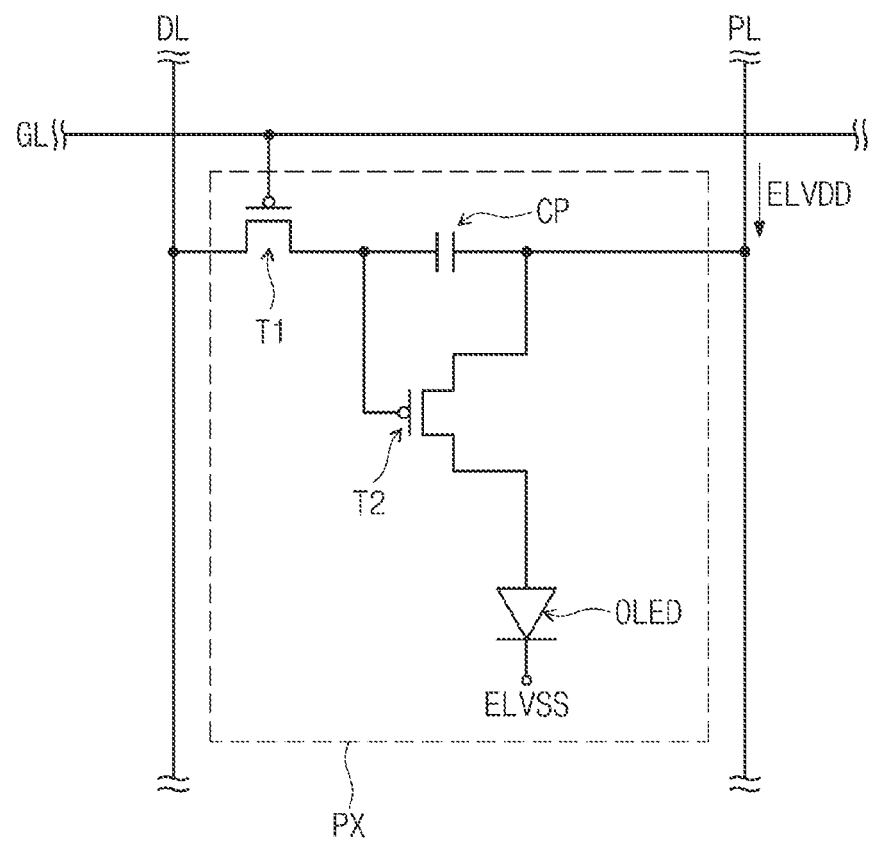
FIG. 4a is an equivalent circuit diagram illustrating an example of a pixel of FIG. 3.
Figure 4B:
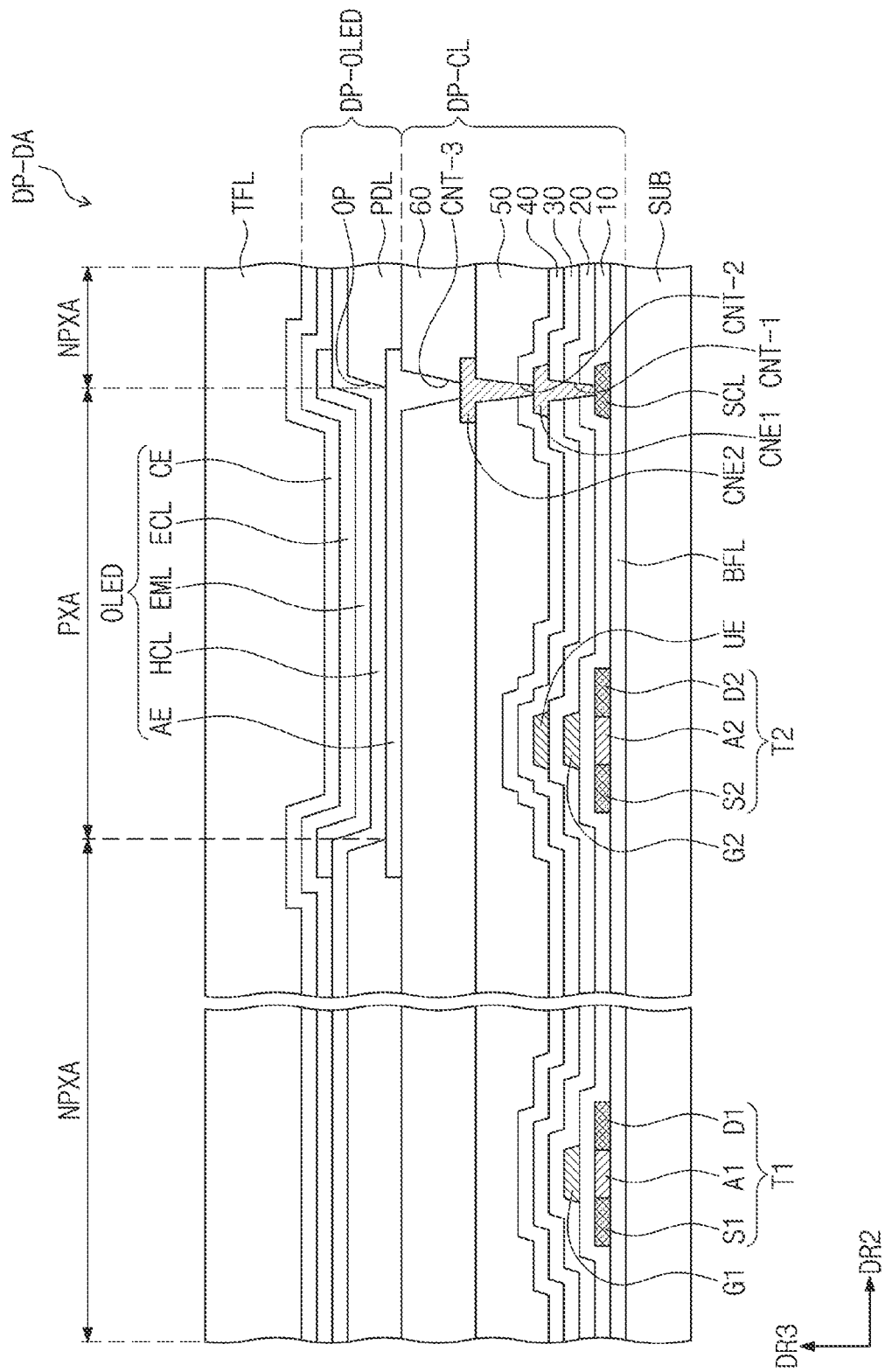
FIG. 4b is an enlarged cross-sectional view of the display panel according to an embodiment of the present invention.
Figure 4C:
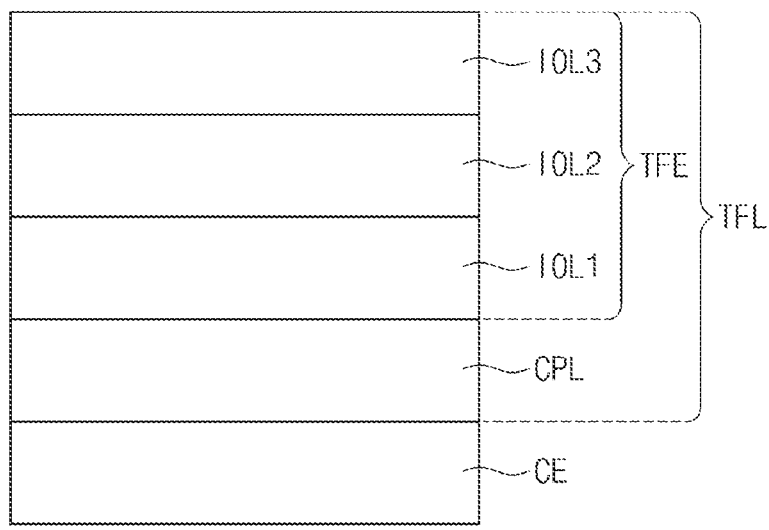
FIG. 4c is a cross-sectional view illustrating a portion of the display panel according to an embodiment of the present invention.

FIG. 3 is a plan view of a display panel according to an embodiment of the present invention. FIG. 4a is an equivalent circuit view illustrating an example of a pixel of FIG. 3. FIG. 4b is an enlarged cross-sectional view of the display panel according to an embodiment of the present invention.

Referring to FIG. 3, a display panel DP may include a driving circuit GDC, a plurality of signal lines SGL, a plurality of pads DP-PD, a plurality of first connection pads DPS-PD, and a plurality of pixels PX (hereinafter, referred to as pixels). The pixels PX are disposed on the display area DP-DA. Each of the pixels PX includes an organic light emitting diode and a pixel driving circuit connected to the organic light emitting diode. The driving circuit GDC, the signal lines SGL, the pads DP-PD, the first connection pads DPS-PD, and the pixel driving circuit may be included in the circuit element layer DP-CL illustrated in FIG. 2.

The driving circuit GDC sequentially outputs gate signals to the plurality of gate lines GL. The driving circuit GDC may further output other control signals to the pixels PX. The driving circuit GDC may include a plurality of thin film transistors that are manufactured through the same process as the driving circuit of the pixel PX, e.g., a low temperature polycrystalline silicon (LTPS) process or a low temperature polycrystalline oxide (LTPO) process.

The signal lines SGL include gate lines GL, data lines DL, a power line PL, and a control signal line CSL. The gate lines GL are respectively connected to corresponding pixels of the pixels PX, and the data lines DL are respectively connected to corresponding pixels PX of the pixels PX. The power line PL is connected to the pixels PX. The control signal line CSL may provide control signals to the driving circuit GDC.

The signal lines SGL overlap the display area DP-DA and the non-display area DP-NDA. Each of the signal lines SGL may include a pad part and a line part. The line part overlaps the display area DP-DA and the non-display area DP-NDA. The pad part is connected to an end of the line part. The pad part is disposed on the non-display area DP-NDA and overlaps a corresponding pad among the pads DP-PD.

Hereinafter, in this specification, an area in which the pads DP-PD are disposed among the non-display area DP-NDA is defined as a chip area NDA-DC, and an area in which the first connection pads DPS-PD are disposed, may be defined as a first pad area NDA-PC.

According to an embodiment of the present invention, the electronic component DC of FIG. 1b may be mounted on the chip area NDA-DC. The pads DP-PD are electrically connected to the electronic component DC to transmit the electrical signal received from the electronic component DC to the signal lines SGL.

In detail, the pads DP-PD includes first pads DP-PD1 arranged in a first row along the first direction DR1 and second pads DP-PD2 arranged in a second row along the first direction DR1. However, the embodiment of the present invention is not limited thereto. For example, the pads DP-PD may be arranged in one row along the first direction DR1.

A portion of the circuit board PCB may be disposed on the first pad area NDA-PC. The first connection pads DPS-PD are electrically connected to the circuit board PCB to transmit the electrical signal received from the circuit board PCB to the pads DP-PD. The circuit board PCB may be rigid or flexible. For example, when the circuit board PCB is flexible, the circuit board PCB may be provided as a flexible printed circuit board.

The circuit board PCB may include a timing control circuit that controls an operation of the display panel DP. The timing control circuit may be mounted in the form of an integrated chip on the circuit board PCB. Also, although not shown, the circuit board PCB may include an input sensing circuit that controls the input sensing layer ISU.

The circuit board PCB may include second connection pads DPS-PDz electrically connected to the display panel DP. The second connection pads DPS-PDz may be disposed on a second pad area defined on the circuit board PCB. The second connection pads DPS-PDz are electrically bonded to the first connection pads DPS-PD. For example, the first connection pads DPS-PD and the second connection pads DPS-PDz may be electrically connected to each other through an anisotropic conductive film or may be in contact with each other in the ultrasonography bonding manner.

Referring to FIG. 4a, the display area DP-DA may be defined as an area on which the pixels PX are disposed. Each of the pixels PX includes an organic light emitting diode OLED and a pixel driving circuit connected to the organic light emitting diode OLED.

In detail, the pixel PX may include a first transistor T1, a second transistor T2, a capacitor CP, and an organic light emitting diode OLED. It is sufficient if the pixel driving circuit includes a switching transistor and a driving transistor, but is not limited to the embodiment described with reference to FIG. 4a. As illustrated in FIG. 4a, although each of the first transistor T1 and the second transistor T2 is provided as a P-MOS transistor, the embodiment of the present invention is not limited thereto. For example, each of the first transistor T1 and the second transistor T2 may be provided as an N-MOS transistor.

The first transistor T1 is connected to the gate line GL and the data line DL. The organic light emitting diode OLED receives a first power voltage ELVDD and a second power voltage ELVSS, which are provided from the power line PL. The first power voltage ELVDD is provided to a first electrode AE of the organic light emitting diode OLED through the second transistor T2, and the second power voltage ELVSS is provided to a second electrode CE of the organic light emitting diode OLED. The second power voltage ELVSS may be less than the first power voltage ELVDD.

Referring to FIG. 4b, the display panel DP may include a plurality of insulating layers, a semiconductor pattern, a conductive pattern, a signal line, and the like. The insulating layer, the semiconductor layer, and the conductive layer may be formed in a manner such as coating, deposition, or the like. Thereafter, the insulating layer, the semiconductor layer, and the conductive layer may be selectively patterned in a photolithography manner. The semiconductor pattern, the conductive pattern, and the signal line, which are provided in the circuit element layer DP-CL and the display element layer DP-OLED, may be formed in the above-described manner. In the display panel DP of FIG. 4b, the pixel driving circuit may further include elements when compared to the pixel driving circuit of FIG. 4a including the first transistor T1 and the second transistor T2. The substrate SUB may be a base substrate that supports the circuit element layer DP-CL and the display element layer DP-OLED. In this specification, the substrate SUB may also be described as a display substrate.

In detail, the substrate SUB may include a synthetic resin film. The synthetic resin layer may include a thermosetting resin. The substrate SUB may have a multi-layered structure. For example, the substrate SUB may have a three-layered structure of a synthetic resin layer, an adhesive layer, and a synthetic resin layer. Particularly, the synthetic resin layer may be a polyimide resin layer, and the material thereof is not particularly limited. The synthetic resin layer may include at least one of an acrylic-based resin, a meth-acrylic-based resin, a polyisoprene-based resin, a vinyl-based resin, an epoxy-based resin, a urethane-based resin, a cellulose-based resin, a siloxane-based resin, a polyamide-based resin, or a perylene-based resin. In addition, the synthetic resin layer may include a glass substrate, a metal substrate, or an organic/inorganic composite substrate.

At least one inorganic layer may be disposed on a top surface of the substrate SUB. The inorganic layer may include at least one of oxide, titanium oxide, silicon oxide, silicon oxide nitride, zirconium oxide, or hafnium oxide. The inorganic layer may be provided as a multilayer. The multilayered inorganic layer may constitute a barrier layer and/or a buffer layer. In this embodiment, the display panel DP may include the buffer layer BFL.

The buffer layer BFL improves bonding force between the substrate SUB and the semiconductor pattern. The buffer layer BFL may include a silicon oxide layer and a silicon nitride layer. The silicon oxide layer and the silicon nitride layer may be alternately laminated.

The semiconductor pattern is disposed on the buffer layer BFL. The semiconductor pattern may include polysilicon. However, the embodiment of the present invention is not limited thereto. For example, the semiconductor pattern may include amorphous silicon or metal oxide.

FIG. 4b illustrates merely a portion of the semiconductor pattern. For example, the semiconductor pattern may be further disposed on other areas of the pixel PX on the plane. The semiconductor pattern may be arranged in a specific rule over the pixels PX. The semiconductor pattern has different electrical properties depending on whether the semiconductor pattern is doped. The semiconductor pattern may include a doped region and a non-doped region. The doped region may be doped with an N-type dopant or a P-type dopant. A P-type transistor includes a doped region into which the P-type dopant is doped.

The doped region may have conductivity greater than that of the non-doped region and substantially act as an electrode or a signal line. The non-doped region may substantially correspond to an active (or a channel) of the transistor. That is to say, a portion of the semiconductor pattern may be an active of the transistor, another portion may be a source or drain of the transistor, and another portion may be a connection electrode or a connection signal line.

As illustrated in FIG. 4b, a source S1, an active A1, and a drain D1 of a first transistor T1 may be formed from the semiconductor pattern, and a source S2, an active A2, and a drain D2 of the second transistor T2 may be formed from the semiconductor pattern. The sources S1 and S2 and the drains D1 and D2 extend from the actives A1 and A2 in directions opposite to each other. FIG. 4b illustrates a portion of the connection signal line SCL formed from the semiconductor pattern. Although not particularly shown, the connection signal line SCL may be connected to the drain D2 of the second transistor T2 on the plane.

A first insulating layer 10 is disposed on the buffer layer BFL. The first insulating layer 10 commonly overlaps the plurality of pixels PX and covers the semiconductor pattern. The first insulating layer 10 may include an inorganic layer and/or an organic layer and have a single-layered or multi-layered structure. The first insulating layer 10 may include at least one of oxide, titanium oxide, silicon oxide, silicon oxide nitride, zirconium oxide, or hafnium oxide. In this embodiment, the first insulating layer 10 may include a single-layered silicon oxide layer. The insulating layer of the circuit element layer DP-CL, which will be described later, as well as the first insulating layer 10 may be an inorganic layer and/or an organic layer and may have a single-layered or a multi-layered structure. The inorganic layer may include at least one of the above-described materials.

Gates G1 and G2 are disposed on the first insulating layer 10. Each of the gates G1 and G2 may be a portion of the metal pattern. The gates G1 and G2 overlap the actives A1 and A2. In the process of doping the semiconductor pattern, the gates G1 and G2 may serve as masks.

A second insulating layer 20 covering the gates G1 and G2 is disposed on the first insulating layer 10. The second insulating layer 20 commonly overlaps the pixels PX. The second insulating layer 20 may be an inorganic layer and/or an organic layer and have a single-layered or multilayered structure. In this embodiment, the first insulating layer 20 may include a single-layered silicon oxide layer.

An upper electrode UE may be disposed on the second insulating layer 20. The upper electrode UE may overlap the gate G2 of the second transistor T2. The upper electrode UE may be a portion of the metal pattern. A portion of the gate G2 and the upper electrode UE overlapping the portion of the gate G2 may define a capacitor CP (see FIG. 4a).

A third insulating layer 30 covering the upper electrode UE is disposed on the second insulating layer 20. In the present embodiment, the third insulating layer 30 may be a single-layered silicon oxide layer. The first connection electrode CNE1 may be disposed on the third insulating layer 30. The first connection electrode CNE1 may be connected to the signal line SCL through a contact hole CNT-1 passing through the first to third insulating layers 10 to 30.

A fourth insulating layer 40 covering the first connection electrode CNE1 is disposed on the third insulating layer 30. The fourth insulating layer 40 may be a single-layered silicon oxide layer. The fifth insulating layer 50 is disposed on a fourth insulating layer 40. The fifth insulating layer 50 may be an organic layer. A second connection electrode CNE2 may be disposed on the fifth insulating layer 50. The second connection electrode CNE2 may be connected to the first connection electrode CNE1 through a contact hole CNT-2 passing through the fourth insulating layer 40 and the fifth insulating layer 50.

A sixth insulating layer 60 covering the second connection electrode CNE2 is disposed on the fifth insulating layer 50. The sixth insulating layer 60 may be an organic layer. A first electrode AE is disposed on the sixth insulating layer 60. The first electrode AE is connected to the second connection electrode CNE2 through a contact hole CNT-3 passing through the sixth insulating layer 60. An opening OP is defined in the pixel defining layer PDL. An opening OP of the pixel defining layer PDL exposes at least a portion of the first electrode AE.

As illustrated in FIG. 4b, the display area DP-PA may include an emission area PXA and a light blocking area NPXA adjacent to the emission area PXA. The light blocking area NPXA may surround the emission area PXA. In this embodiment, the emission area PXA may be defined to correspond to a portion of an area of the first electrode AE exposed by the opening OP.

A hole control layer HCL may be commonly disposed on the emission area PXA and the light blocking area NPXA. The hole control layer HCL may include a hole transport layer and may further include a hole injection layer. The emission layer EML is disposed on the hole control layer HCL. The emission layer EML may be disposed on an area corresponding to the opening OP. That is, the light emitting layer EML may be formed to be separated from each of the pixels.

An electron control layer ECL is disposed on the emission layer EML. The electron control layer ECL may include an electron transport layer and may further include an electron injection layer. The hole control layer HCL and the electron control layer ECL may be commonly formed in the plurality of pixels by using an open mask. The second electrode CE is disposed on the electron control layer ECL. The second electrode CE is provided as a single body and commonly disposed on the plurality of pixels PX.

An insulating layer TFL is disposed on the second electrode CE. The insulating layer TFL may include a plurality of thin films. Like this embodiment, the insulating layer TFL may include a capping layer CPL and a thin film encapsulation layer TFE. The thin film encapsulation layer TFE may include a first inorganic layer IOL1, an organic layer IOL2, and a second inorganic layer IOL3.

The capping layer CPL is disposed on the second electrode CE to be in contact with the second electrode CE. The capping layer CPL may include an organic material. The first inorganic layer IOL1 is disposed on the capping layer CPL to be in contact with the capping layer CPL. The organic layer IOL-2 is disposed on the first inorganic layer IOL1 to be in contact with the first inorganic layer IOL1. The second inorganic layer IOL3 is disposed on the organic layer IOL2 to be in contact with the organic layer IOL2.

The capping layer CPL may protect the second electrode CE from a follow-up process, a sputtering process and improve emission efficiency of the organic light emitting diode OLED. The capping layer CPL may have a refractive index greater than that of the first inorganic layer IOL1.

The first inorganic layer IOL1 and the second inorganic layer IOL3 may protect the display element layer DP-OLED against oxygen/moisture, and the organic layer IOL2 may protect the display element layer DP-OLED against foreign substances such as dust particles. Each of the first inorganic layer IOL1 and the second inorganic layer IOL3 may be one of a silicon oxide layer, a silicon nitride layer, a silicon oxynitride layer, and a silicon oxide layer. According to an embodiment of the present invention, each of the first inorganic layer IOL1 and the second inorganic layer IOL3 may include a titanium oxide layer, an aluminum oxide layer, and the like. The organic layer IOL2 may include an acrylic-based organic layer, but is not limited thereto.

According to an embodiment of the present invention, an inorganic layer, for example, a LiF layer may be further disposed between the capping layer CPL and the first inorganic layer IOL1. The LiF layer may improve emission efficiency of the organic light emitting diode OLED.

Figure 5:
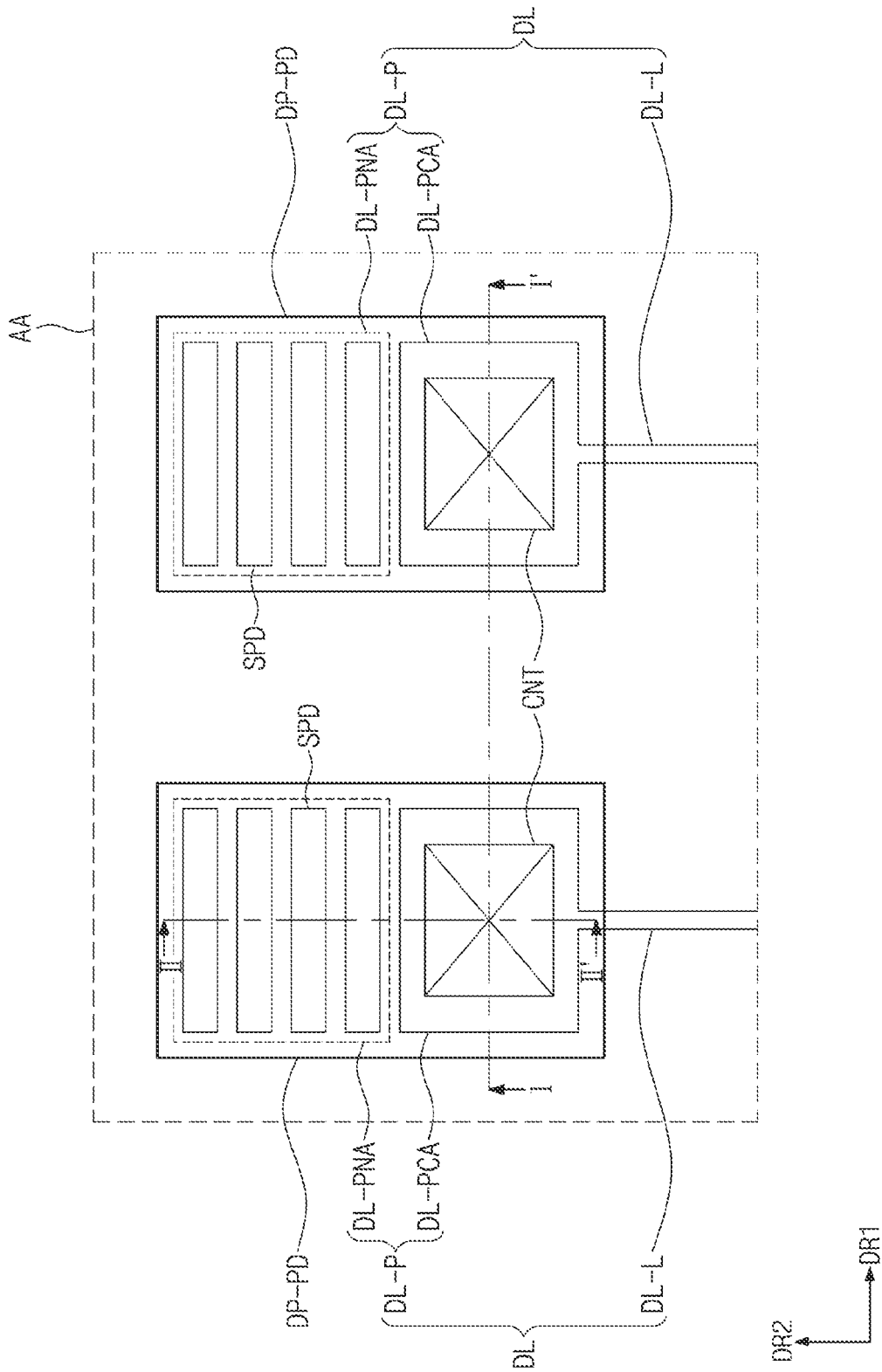
FIG. 5 is an enlarged view of an area AA of FIG. 3 according to an embodiment of the present invention.
Figure 6A:
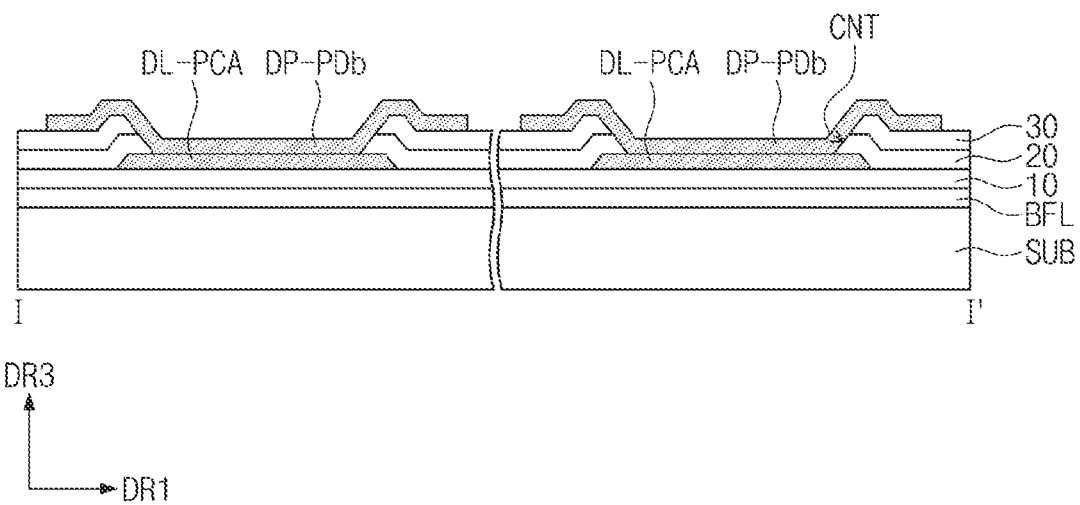
FIG. 6a is a cross-sectional view taken along line I-I' of FIG. 5.
Figure 6B:
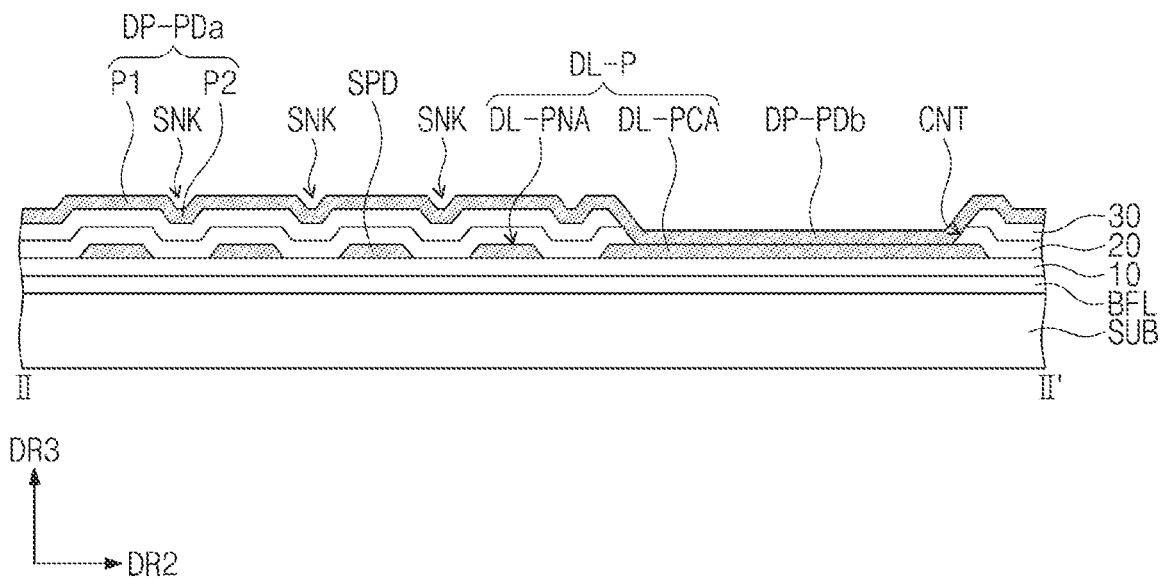
FIG. 6b is a cross-sectional view taken along line II-II' of FIG. 5.

FIG. 5 is an enlarged view of an area AA of FIG. 3 according to an embodiment of the present invention. FIG. 6a is a cross-sectional view taken along line I-I' of FIG. 5. FIG. 6b is a cross-sectional view taken along line II-II' of FIG. 5.

Referring to FIG. 5, two data lines DL (hereinafter, referred to as 'data lines') and two pads DP-PD (hereinafter, referred to as 'pads'), which overlap the non-display area DP-NDA, among the signal lines SGL illustrated in FIG. 3 are illustrated as an example. Although not shown, each of the signal lines SGL illustrated in FIG. 3 may have a structure illustrated in FIG. 5. Although it has been described that each of the signal lines SGL described in FIG. 3 includes a line part and a pad part, the line part and the pad part may be provided as separate configurations. Each of the pad part DL-P may have a surface area greater than that of each of the line parts DL-L in the same length along the second direction DR2.

In detail, the data line DL includes a line part DL-L and a pad part DL-P. Hereinafter, in this specification, the pad part DL-P of the data line DL is described as a signal pad part, and the line part DL-L of the data line DL is described as a signal line part.

The signal pad part DL-P includes a first signal pad part DL-PNA and a second signal pad part DL-PCA. According to the present invention, the first signal pad part DL-PNA and the second signal pad part DL-PCA may be electrically insulated from each other. The first signal pad part DL-PNA and the second signal pad part DL-PCA may face each other in one direction and may be spaced apart from each other on a plane. Here, the one direction may mean the second direction DR2.

Particularly, the first signal pad part DL-PNA may include a plurality of signal pad portions SPD spaced apart from each other on the plane. According to an embodiment, the signal pad portions SPD may extend in the first direction DR1 and may have a shape arranged to be spaced a predetermined interval from each other in the second direction DR2. For example, although four signal pad portions SPD are illustrated in FIG. 5, the number of signal pad portions SPD is not limited thereto, and the number of signal pad portions SPD may be variously changed.

The second signal pad part DL-PCA is electrically connected to the signal line part DL-L. The second signal pad part DL-PCA may be electrically connected to the circuit element layer DP-CL illustrated in FIG. 2 through the signal line part DL-L. The second signal pad part DL-PCA may face any one of the signal pad portions SPD of the first signal pad part DL-PNA and may be provided in a shape that is integrated with the signal line part DL-L. The integrated shape means that the components are formed by the same process. A planar area of the second signal pad part DL-PCA may be greater than that of each of the signal pad portions SPD.

According to an embodiment of the present invention, each of the signal pad portions SPD of the first signal pad part DL-PNA may be maintained in an insulated state. For example, the first signal pad part DL-PNA may be electrically insulated from the second signal pad part DL-PCA. Further, the signal pad portions SPD may be provided in a structure, which are spaced apart from each other in the second direction DR2, and thus may be insulated from each other.

The pad DP-PD may cover the signal pad part DL-P. In this specification, the meaning that a configuration A covers a configuration B may mean that the configuration A entirely overlaps the configuration B on the plane. Hereinafter, in this specification, the pad DP-PD will be described as a connection pad part.

The connection pad part DP-PD may include a first connection pad part overlapping the first signal pad part DL-PNA and a second connection pad part overlapping the second signal pad part DL-PCA. For example, the first connection pad part and the second connection pad part may be provided in an integrated shape to be electrically connected to each other. Particularly, the second connection pad part may be in electrical contact with the second signal pad part DL-PCA through the contact hole CNT.

According to an embodiment of the present invention, the signal pad part DL-P and the signal line part DL-L may be disposed on the first insulating layer 10 illustrated in FIG. 4b. That is, the signal pad part DL-P and the signal line part DL-L may be formed on the first insulating layer 10 by the same process as the gates G1 and G2.

In detail, referring to FIG. 6a, a lamination structure of the substrate SUB, the buffer layer BFL, and the first to third insulating layers 10 to 30, which are described with reference to FIG. 4b is illustrated. The second signal pad part DL-PCA may be in electrical contact with the second connection pad part DP-PDb of the connection pad part DP-PD through the contact hole CNT passing through the second insulating layer 20 and the third insulating layer 30.

According to the present invention, although the contact hole CNT passes through two second and third insulating layers 20 and 30, the contact hole CNT may have a structure that passes through at least one insulating layer. For example, the signal pad part DL-P and the signal line part DL-L may be disposed on the second insulating layer 20 illustrated in FIG. 4b. In this case, the signal pad part DL-P and the signal line part DL-L may be formed on the second insulating layer 20 by the same process as the upper electrode UE. Thus, the second signal pad part DL-PCA may be in electrical contact with the second connection pad part DP-PDb of the connection pad part DP-PD through the contact hole CNT passing through the third insulating layer 30.

Referring to FIG. 6b, the signal pad portions SPD of the first signal pad part DL-PNA are disposed on the first insulating layer 10 to be spaced a predetermined interval from each other in the second direction DR2. The second signal pad part DL-PCA may be disposed on the first insulating layer 10 and may be spaced apart from the first signal pad part DL-PNA on the plane.

The second insulating layer 20 covers a portion of the first signal pad part DL-PNA and the second signal pad part DL-PCA and is disposed on the first insulating layer 10. The third insulating layer 30 is disposed on the second insulating layer 20. The contact hole CNT may overlap the second signal pad part DL-PCA and may be defined in each of the second insulating layer 20 and the third insulating layer 30. The contact hole CNT according to the present invention may not overlap the first signal pad part DL-PNA.

The first connection pad part DP-PDa of the connection pad part DP-PD may overlap the first signal pad part DL-PNA and may be disposed on the third insulating layer 30. The second connection pad part DP-PDb of the connection pad part DP-PD may be directly disposed on the second signal pad part DL-PCA through the contact hole CNT. That is, the second connection pad part DP-PDb of the connection pad part DP-PD may be in electrical contact with the second signal pad part DL-PCA.

According to an embodiment of the present invention, the first connection pad part DP-PDa includes first portions P1 and second portions P2, which are alternately and repeatedly disposed along the second direction DR2. The first portions P1 arranged at a predetermined interval along the second direction DR2 may overlap the signal pad portions SPD, respectively, and the second portions P2 may not overlap the signal pad portions SPD.

Each of the first to third insulating layers 10 to 30 according to the present invention may be provided as an inorganic film. Thus, a stepped portion may occur between the first portion P1 and the second portion P2 of the first connection pad part DP-PDa by the signal pad portion SPD. The second portion P2 may have a shape that is recessed in a direction from the first portion P1 toward the substrate SUB and may overlap between two adjacent signal pad portions SPD. The recessed shape of the second portion P2 may have a shape extending in the first direction DR1. Hereinafter, a space defined by the adjacent two signal pad portions SPD and the second portion P2 is defined as an inner space SNK.

Although not shown in FIG. 6b, the first portion P1 of the first connection pad part DP-PDa may be in electrical contact with the electronic component DC illustrated in FIG. 1b through the ultrasonography bonding. This will be described in more detail with reference to FIG. 7.

Figure 7:
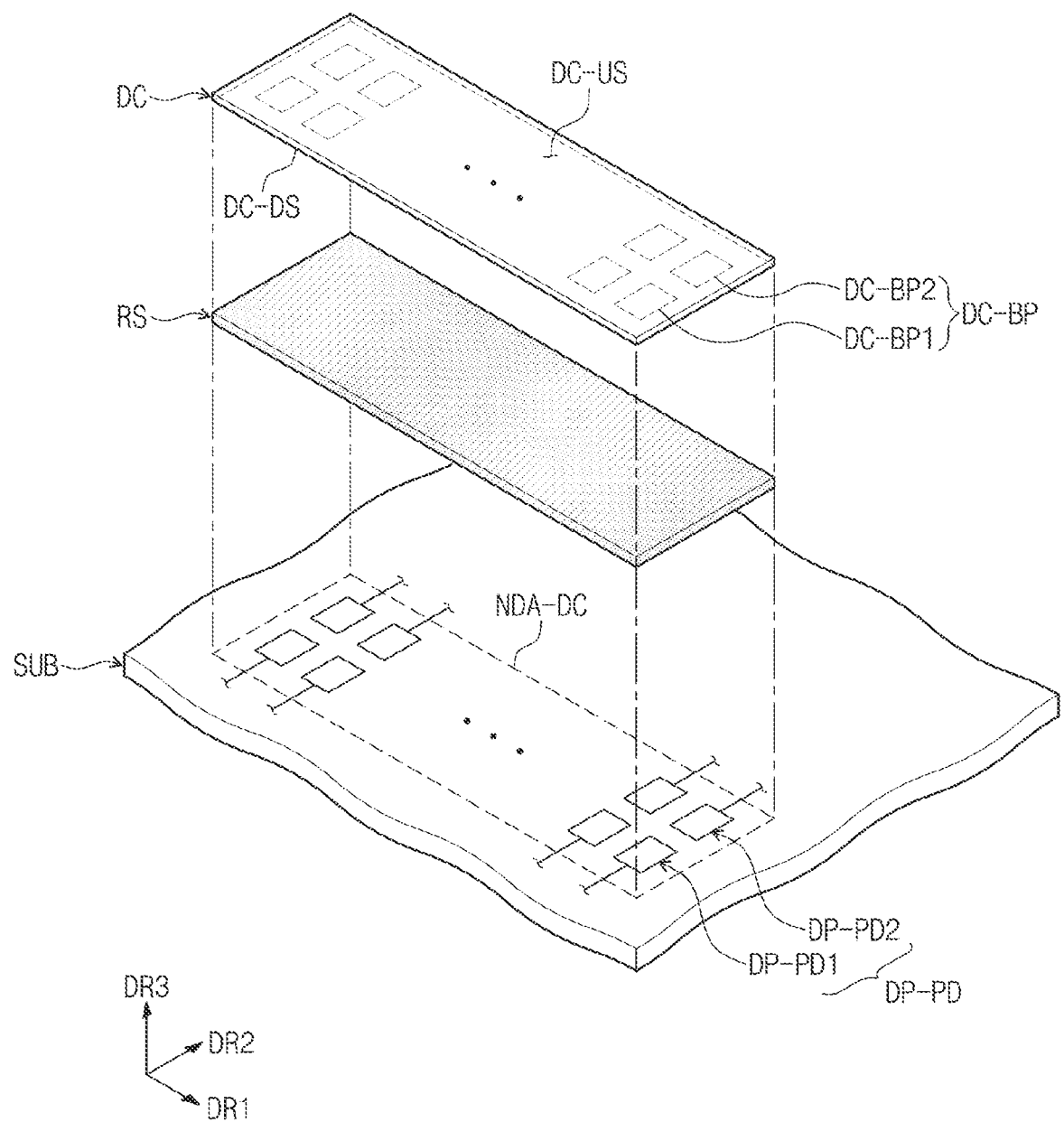
FIG. 7 is an exploded perspective view of a display device according to an embodiment of the present invention.
Figure 9B:
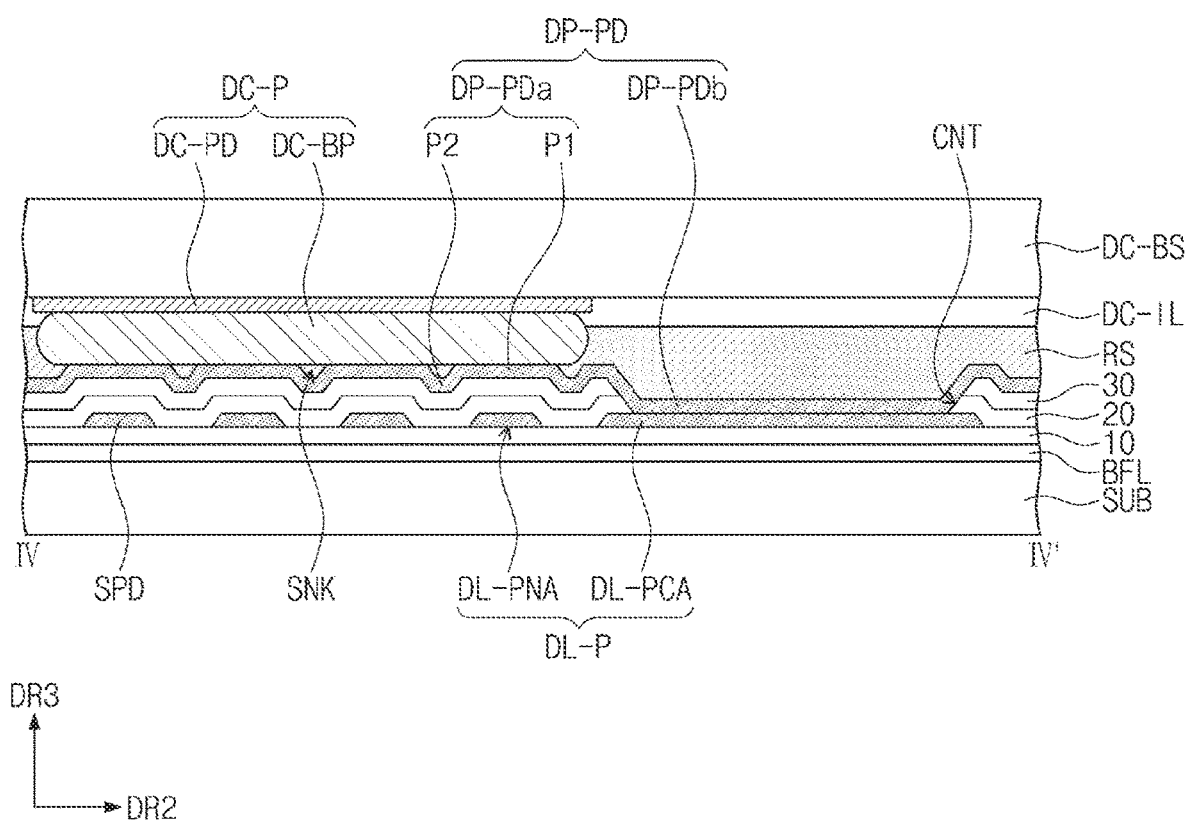
FIG. 9b is a cross-sectional view taken along line IV-IV' of FIG. 8.

FIG. 7 is an exploded perspective view of a display device according to an embodiment of the present invention. FIG. 8 is a plan view of an electronic component according to an embodiment of the present invention. FIG. 9a is a cross-sectional view taken along line of FIG. 8. FIG. 9b is a cross-sectional view taken along line IV-IV' of FIG. 8.

Referring to FIG. 7, the electronic component DC includes a top surface DC-US and a bottom surface DC-DS. In this specification, the bottom surface DC-DS of the electronic component DC may be a surface facing the display panel DP.

The electronic component DC includes bumps DC-BP (hereinafter, referred to as 'bumps') that are in contact with the pads DP-PD, respectively, which are disposed on the substrate SUB described with reference to FIG. 3. The bumps DC-BP include a first bump DC-BP1 arranged in a first row along a first direction DR1 and a second bump DC-BP2 arranged in a second row along the first direction DR1. Each of the first bump DC-BP1 and the second bump DC-BP2 may have a shape that is exposed to the outside from the bottom surface of the electronic component DC.

Also, as illustrated in FIG. 8, the electronic component DC includes a pad area PA on which the bumps DC-BP are disposed and a non-pad area NPA adjacent to the pad area PA. Although not shown, the electronic component DC may include a signal line disposed on the non-pad area NPA and connected to the bump DC-BP.

Referring again to FIG. 7, the first bump DC-BP1 and the first pad DP-PD1 are in electrical contact with each other through the ultrasonography bonding manner. The second bump DC-BP2 and the second pad DP-PD2 are in electrical contact with each other through the ultrasonography bonding manner. Hereinafter, the first pad DP-PD1 is described as a first connection pad part, and the second pad DP-PD2 is described as a second connection pad part. Although not shown, the electronic component DC may include a circuit element that provides an electrical signal to each of the first bump DC-BP1 and the second bump DC-BP2.

A filler RS may be disposed between the electronic component DC and the substrate SUB. The filler RS may surround an outer surface of the bump DC-BP and the signal pad DP-PD, which are bonded to each other through the ultrasonography bonding, and be disposed between the electronic component DC and the substrate SUB. Since the filler RS is disposed between the electronic component DC and the display panel DP, the bump DC-BP and the connection pad part DP-PD may be blocked from external air. As a result, the bump DC-BP and the connection pad part DP-PD may be prevented from being oxidized by the external air. Also, before the bumps DC-BP and the connection pad part DP-PD are bonded to each other through the ultrasonography bonding, the filler RS may overlap the bump DC-BP on the plane overall.

According to an embodiment of the present invention, a process of forming the filler RS between the electronic component DC and the substrate SUB may be performed at the same time as the ultrasonography bonding process of bonding the electronic component DC and pad part DP-PD.

In detail, the filler RS may be provided in a film type and may be provided as an adhesive resin of which curing properties are changed according to external heat. For example, during a first period for which a temperature of the filler RS increases from a first reference point to a second reference point through the external heat, viscosity characteristics of the filler RS may be lowered. That is, during the first period, the curing characteristics of the filler RS may be deteriorated. Thereafter, during a second period for which a temperature of the filler RS increases above the second reference point, the viscosity characteristics of the filler RS may be improved. That is, the curing characteristics of the filler RS may be improved during the second period.

Particularly, during the first period, the electronic component DC may be disposed on the chip area NDA-DC of the substrate SUB through an external pressure. When the external pressure is applied to the electronic component DC, external heat may be transferred to the filler RS disposed between the electronic component DC and the substrate SUB. Also, during the first period, the bump DC-BP and the connection pad part DP-PD may be in contact with each other, and the ultrasonography bonding process may be performed.

Referring to FIG. 9a, the electronic component DC includes a base substrate DC-BS, a driving pad part DC-P, and a pad insulating layer DC-IL. The driving pad part DC-P includes a driving pad DC-PD and a bump DC-BP.

A top surface of the base substrate DC-BS may correspond to the top surface DC-US of the electronic component DC. A bottom surface of the pad insulating layer DC-IL facing the display panel DP may correspond to the bottom surface DC-DS of the electronic component DC. For example, the base substrate DC-BS may include a silicon material.

The driving pad DC-PD may be disposed on a bottom surface of the base substrate DC-BS. The driving pad DC-PD may be electrically connected to a circuit element (not shown) of the electronic component DC. The pad insulating layer DC-IL may expose a portion of the driving pad DC-PD and may be disposed on the bottom surface of the base substrate DC-BS. In this case, a through-hole exposing a portion of the driving pad DC-PD may be defined by the pad insulating layer DC-IL. The bump DC-BP may be disposed directly on the driving pad DC-PD. According to an embodiment, the driving pad DC-PD may be omitted.

According to an embodiment of the present invention, the bump DC-BP may be in electrical contact with the connection pad part DP-PD by the ultrasonography bonding manner. In detail, when ultrasonic vibration is applied to an interface between the bump DC-BP and the pad DP-PD, frictional heat is generated at the interface. In addition, as external heat/pressure is applied to the top surface of the base substrate DC-BS, the interface between the bump DC-BP and the connection pad part DP-PD may be bonded (or welded) to each other by the frictional heat.

Thus, as the bump DC-BP and the connection pad part DP-PD are in electrical contact with each other, the bump DC-BP and the signal pad part DL-P may be electrically connected to each other.

Also, the filler RS may be disposed between the pad insulating layer DC-IL and the third insulating layer 30 and may be cured according to the external heat/pressure. That is, in the filler RS according to the present invention, a separate curing process due to external ultraviolet rays or the like may be omitted. Thus, as a time required to cure the filler RS is omitted, the overall process time of the display device DD may be reduced.

FIG. 9b is a view illustrating a state in which the electronic component DC and the connection pad part DP-PD are bonded to each other through the ultrasonography bonding. The bump DC-BP may overlap the first connection pad part DP-PDa of the connection pad part DP-PD and may not overlap the second connection pad part DP-PDb of the connection pad part DP-PD. As previously described with reference to FIG. 6b, the first connection pad part DP-PDa of the connection pad part DP-PD includes the first portions P1 and the second portions P2, which are alternately and repeatedly disposed along the second direction DR2.

According to an embodiment of the present invention, the first portion P1 may be in electrical contact with the bump DC-BP, and the second portion P2 may not be electrically connected to the bump DC-BP. That is, a driving signal output from the circuit element of the electronic component DC may be transmitted to the first portion P1 through the bump DC-BP. As a result, the driving signal may be transmitted to the second signal pad part DL-PCA through the first portion P1 and the second connection pad part DP-PDb.

Before the ultrasonography bonding between the bump DC-BP and the first connection pad part DP-PDa, the filler RS may be disposed between the electronic component DC and the substrate SUB in a film type. In this case, the filler RS may entirely overlap the connection pad part DP-PD and may also overlap the third insulating layer 30. Thereafter, as the external heat according to the ultrasonography bonding process is applied to the filler RS, viscosity of the filler RS may be reduced. As a result, the filler RS may have flow characteristics.

The external pressure may be applied to the bump DC-BP while the heat is applied to the filler RS. The external pressure applied to the bump DC-BP may be an intensity at which the bump DC-BP is in contact with the first portion P1 of the first connection pad part DP-PDa.

As the bump DC-BP is in contact with the first portion P1 by the external pressure, the filler RS disposed between the bump DC-BP and the first portion P1 may move to another space by a pressure of the bump DC-BP. Hereinafter, in this specification, the filler RS disposed between the bump DC-BP and the first portion P1 will be described as a first filling portion, and the filler RS overlapping between the bump DC-BP and the second portion P2 will be described as a second filling portion.

As the filler RS has flow characteristics due to the external heat, the first filling portion may move to the inner space SNK. Here, the inner space SNK may be defined by the first portion P1, the second portion P2, and the bump DC-BP.

On the other hand, unlike the present invention, when the first portion P1 has a structure surrounding the second portion P2 on the plane, the inner space is not connected to an outer space. In this case, when the first filling portion moves to the inner space by the pressure of the bump DC-BP, a volume of the inner space may increase as the first filling portion and the second filling portion are combined with each other. As a result, lifting occurs between the bump DC-BP and the first connection pad part DP-PDa to deteriorate electrical connection characteristics.

According to an embodiment of the present invention, the inner space SNK extends in the first direction DR1 and may be connected to an outer space between the electronic component DC and the first connection pad part DP-PDa. The outer space between the electronic component DC and the first connection pad part DP-PDa may be a space that does not overlap the bump DC-BP. As the inner space SNK is connected to the outer space, when the first filling portion moves to the inner space SNK, the second filling portion disposed in the existing inner space SNK may move to the outer space. The second filling portion disposed in the inner space SNK may move to the outer space along the first direction DR1.

Also, it has been described that the second filling portion moves to the outer space as the first filling portion moves to the inner space SNK, but the present invention is not limited thereto. A portion of the first filling portion may also move to the outer space.

As described above, it is possible to prevent lifting between the bump DC-BP and the first connection pad part DP-PDa due to the volume of the filler RS disposed in the inner space SNK. This will be described in more detail later with reference to FIGS. 14b and 14c.

Figure 10A:
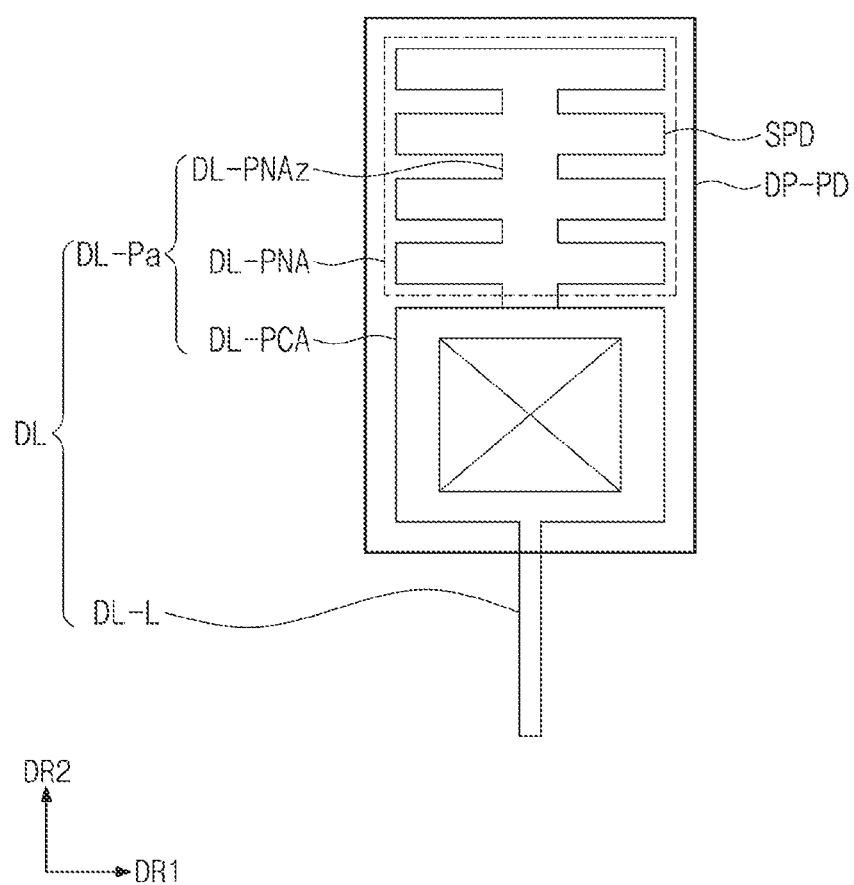
FIG. 10a is a plan view of a pad part according to another embodiment of the present invention.
Figure 10B:
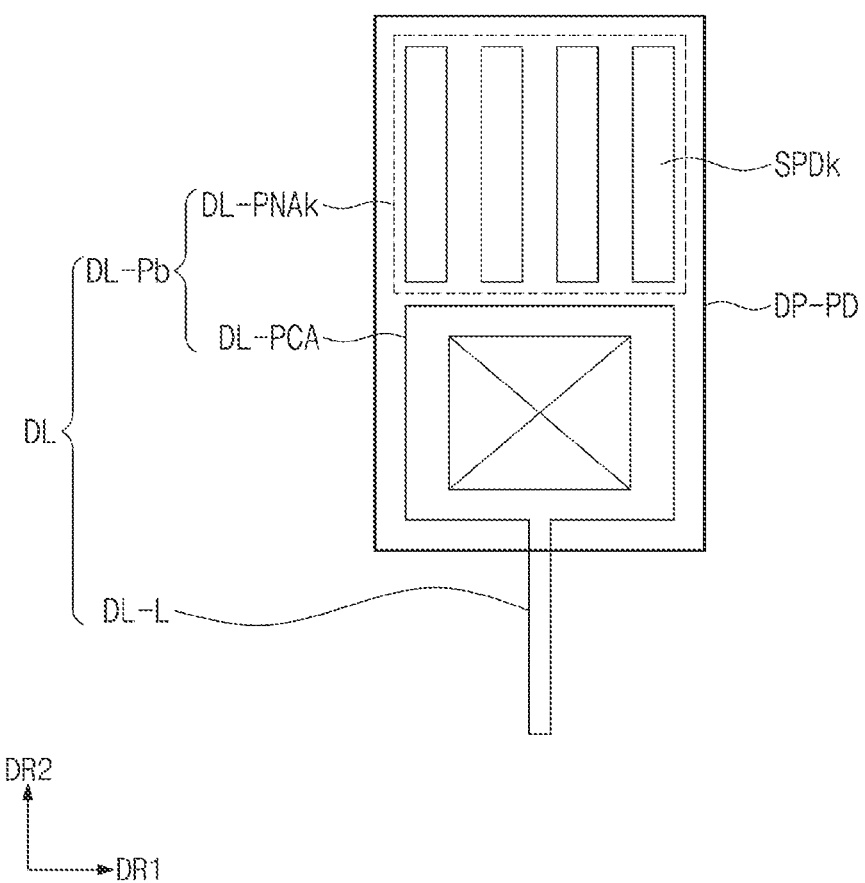
FIG. 10b is a plan view of a pad part according to another embodiment of the present invention.
Figure 11:
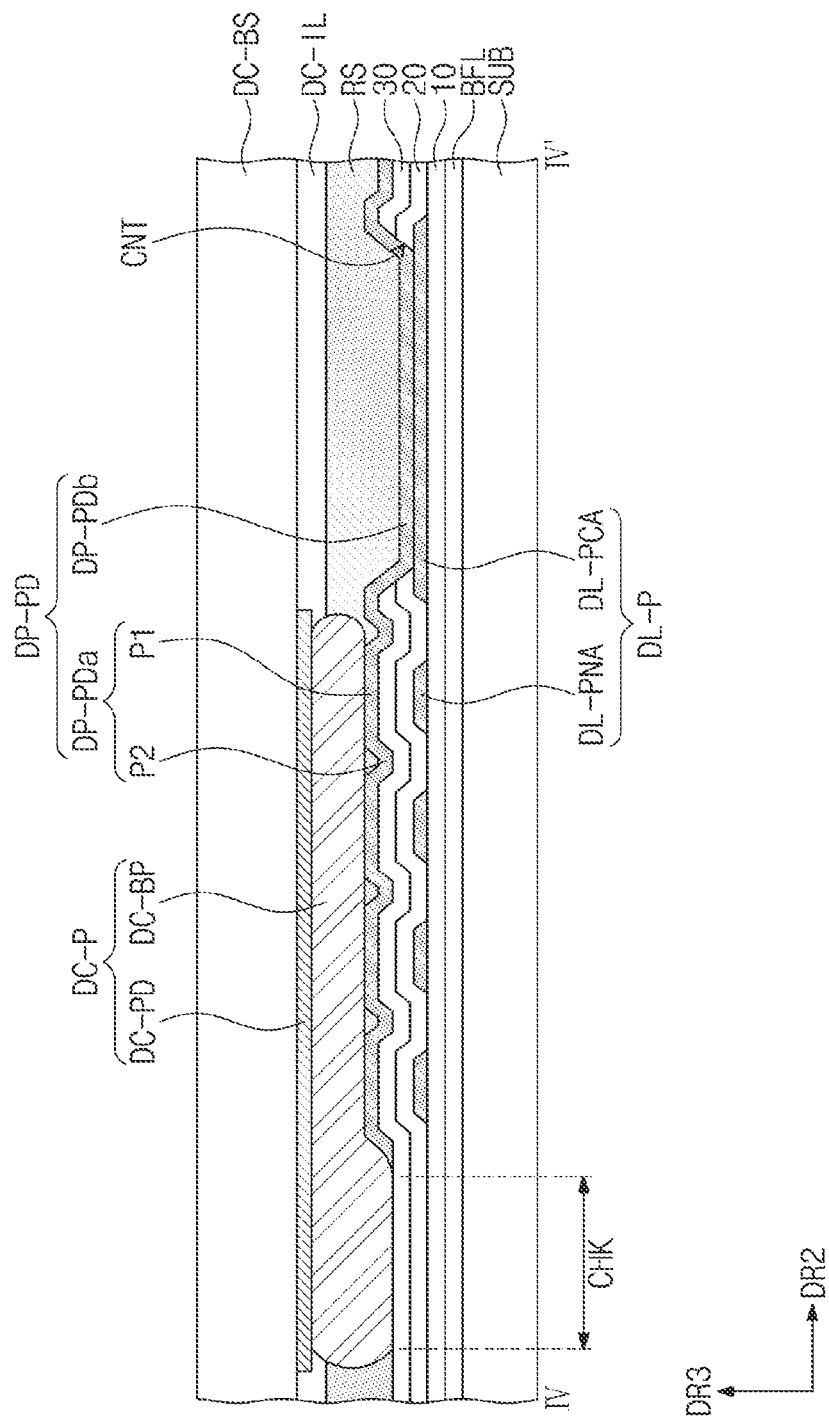
FIG. 11 is a cross-sectional view of a display device according to another embodiment of the present invention.

FIG. 10a is a plan view of a pad part according to another embodiment of the present invention. FIG. 10b is a plan view of a pad part according to another embodiment of the present invention. FIG. 11 is a cross-sectional view of a display device according to another embodiment of the present invention.

Referring to FIG. 10a, a signal pad part DL-Pa according to another embodiment of the present invention may further include third signal pad parts DL-PNAz when compared to the signal pad part DL-P illustrated in FIG. 5.

The third signal pad parts DL-PNAz may be arranged at a predetermined interval along the second direction DR2. The third signal pad part DL-PNAz according to the present invention may electrically connect a signal pad portion SPD to a first signal pad part DL-PNA. Also, the third signal pad parts DL-PNAz and the first signal pad part DL-PNA may be provided in an integrated shape.

For example, the third signal pad parts DL-PNAz includes a first sub pad portion and a second sub pad portion. The first sub pad portion is disposed between two adjacent signal pad portions of the signal pad portions SPD. The first sub pad portion electrically connects the two signal pad portions. The first sub pad portion may be provided in plurality. The second sub pad portion includes a second sub pad portion electrically connecting one of the signal pad portions SPD to the second signal pad part DL-PCA.

Particularly, an inner space SNK connected to the outer space discussed in FIG. 9b may be defined by a bump DC-BP, a first portion P1, a second portion P2, and the first sub pad portion of the third signal pad part DL-PNAz.

Referring to FIG. 10b, a signal pad part DL-Pb according to another embodiment of the present invention may have substantially the same structure except for a modified structure of the first signal pad part DL-PNAk when compared to the signal pad part DL-P illustrated in FIG. 5.

The first signal pad part DL-PNAk includes signal pad portions SPDk spaced apart from each other on the plane. The signal pad portions SPDk may extend in the second direction DR2 and may be spaced a predetermined interval from each other along the first direction DR1. In this case, an inner space SNK connected to the outer space discussed in FIG. 9b may be defined by a bump DC-BP, a first portion P1, and a second portion P2. However, in the structure of FIG. 10b, the inner space SNK may have a shape extending in the second direction DR2.

According to the present invention, each of the signal pad portions SPDk may face the second signal pad part DL-PCA in the second direction DR2.

Referring to FIG. 11, the bump DC-BP includes a first bump portion overlapping a first connection pad part DP-PDa and a second bump portion that does not overlap the first connection pad part DP-PDa. As illustrated in FIG. 11, the second bump portion may be in contact with a third insulating layer 30. Hereinafter, an area CHK on which the second bump portion and the third insulating layer 30 are in contact with each other is defined as an inspection area.

Particularly, a planar area of the second bump portion, i.e., the inspection area may be provided as 10% to 50% of the total planar area of the bump DC-BP.

According to the present invention, after the ultrasonography bonding process, contact reliability between the first bump portion and the first connection pad part DP-PDa may be obtained by checking a color of a contact area between the second bump portion and the third insulating layer 30.

Figure 12:
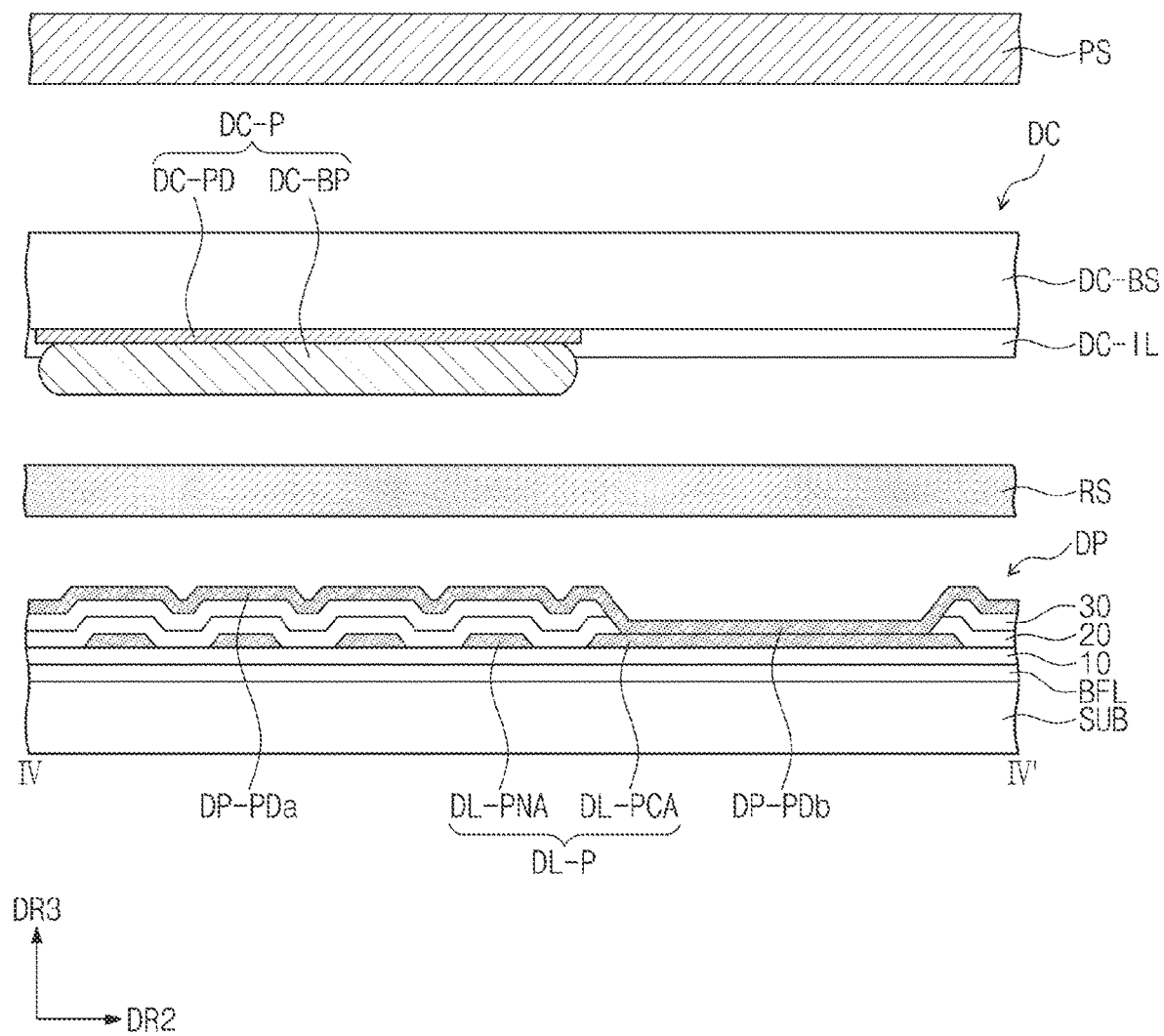
FIG. 12 is a view illustrating a method for manufacturing a display device according to an embodiment of the present invention.
Figure 13:
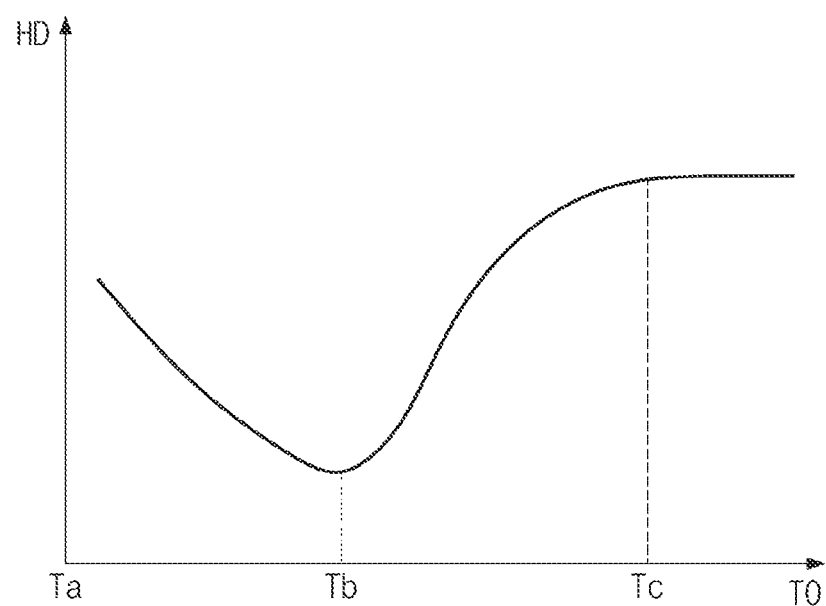
FIG. 13 is a graph illustrating characteristics of a filler.

FIG. 12 is a view illustrating a method for manufacturing a display device according to an embodiment of the present invention. FIG. 13 is a graph illustrating characteristics of a filler.

FIG. 12 is an exploded perspective view of a display device DD on which ultrasonography bonding is performed between an electronic component DC and a display panel DP. A filler RS is disposed between the electronic component DC and the display panel DP and is provided in a film type. The filler RS may entirely overlap the chip area NDA-DC illustrated in FIG. 3.

Referring to FIG. 12, a heat/pressure mechanism PS may be disposed on the electronic component DC to apply a pressure to the electronic component DC. Also, the heat/pressure mechanism PS may apply heat to the filler RS, the bump DC-BP, and the first connection pad part DP-PDa, which are disposed between the electronic component DC and the display panel DP. According to the present invention, the heat/pressure mechanism PS may apply a pressure to the electronic component DC and apply heat to the filler RS.

On the other hand, as described above, the filler RS may change curing characteristics according to the heat transferred from the heat/pressure mechanism PS.

Referring to FIG. 13, a horizontal direction of the graph represents a temperature TO, and a vertical direction of the graph represents viscosity characteristics HD of the filler RS. The viscosity of the filler RS may decrease during a first period for which the temperature of the filler RS increases from a first reference point Ta to a second reference point Tb through external heat. For example, the temperature of the first reference point Ta to the second reference point Tb may be 0 degrees or more and 30 degrees or less.

Thereafter, the viscosity of the filler RS may increase during the second period for which the temperature of the filler RS increases above the second reference point Tb. That is, the curing characteristics of the filler RS may be improved during the second period. Also, when the temperature of the filler RS increases above a third reference point Tc, the viscosity of the filler RS may not be substantially changed. That is, the curing characteristics of the filler RS may be the highest by using the third reference point Tc as a reference point. For example, the temperature of the second reference point Tb to the third reference point Tc may be 30 degrees or more and 190 degrees or less.

As described above with reference to FIG. 9b, as the bump DC-BP is in contact with the first portion P1 through the pressure of the heat/pressure mechanism PS, a first filling portion P1 between the bump DC-BP and the first portion may move to an inner space SNK.

According to the present invention, flow characteristics of the filler RS may be maintained in the first period for which viscosity characteristics of the filler RS decrease. This is because curing characteristics of the filler RS increase while the temperature of the filler RS enters the second period.

Therefore, during the first period for which the filler RS has flow characteristics, the second filling portion that is previously disposed in the inner space SNK may move to an outer space by the first filling portion moving to the inner space SNK.

Figure 14A:
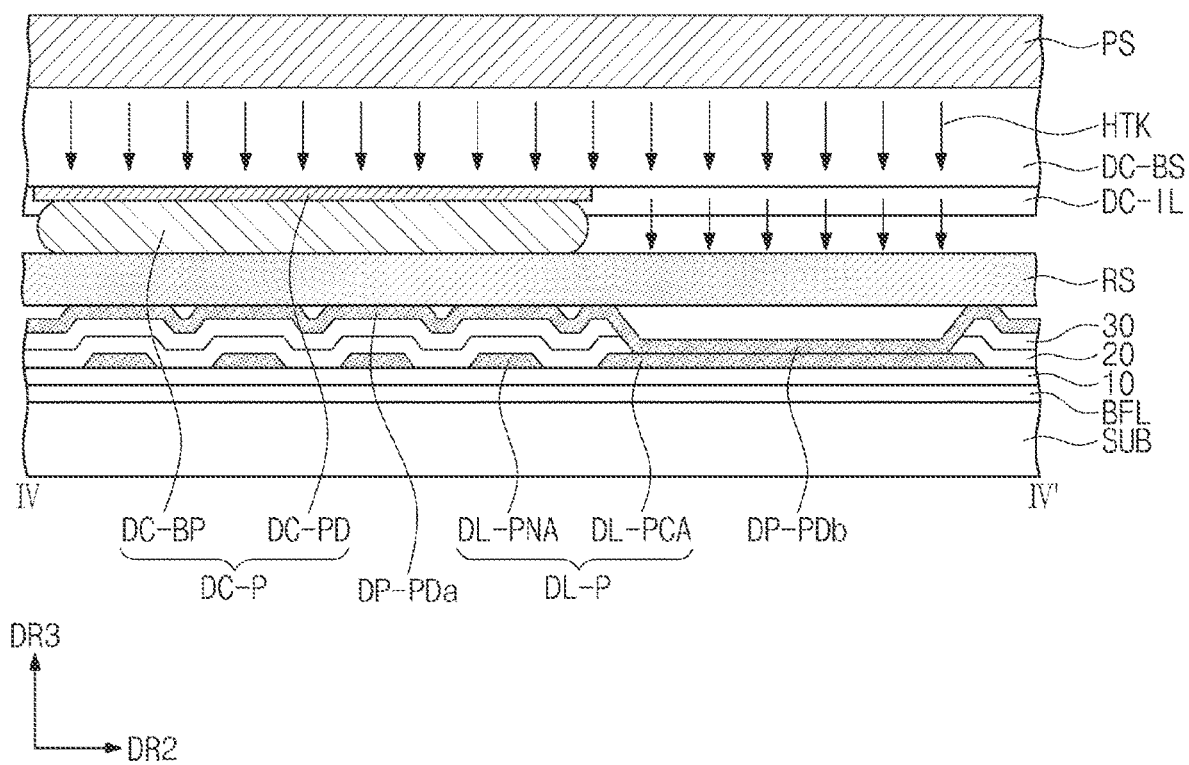
FIG. 14a is a cross-sectional view illustrating the method for manufacturing the display device according to an embodiment of the present invention.
Figure 14B:
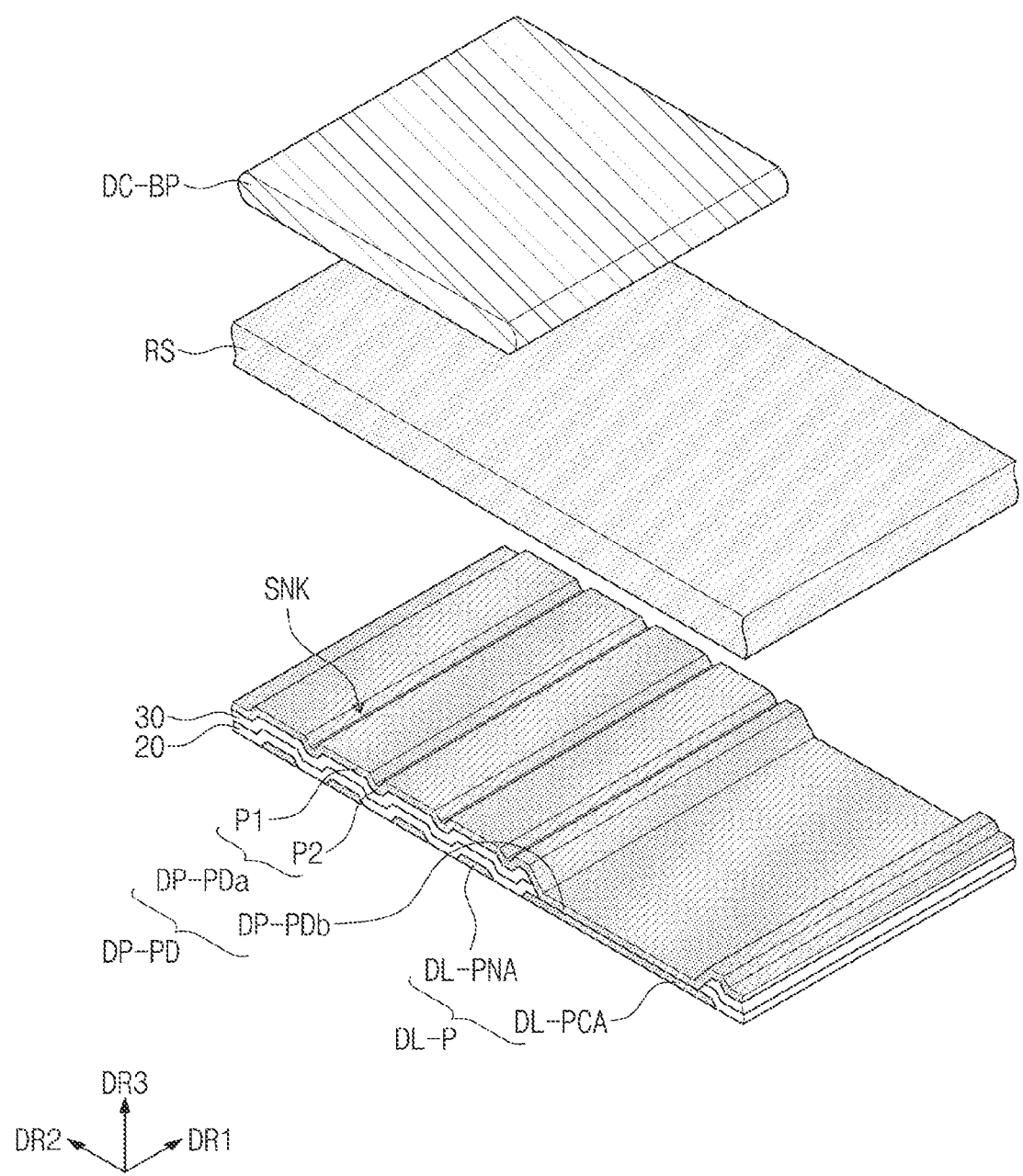
FIG. 14b is an exploded perspective view of a display device according to an embodiment of the present invention.
Figure 14C:
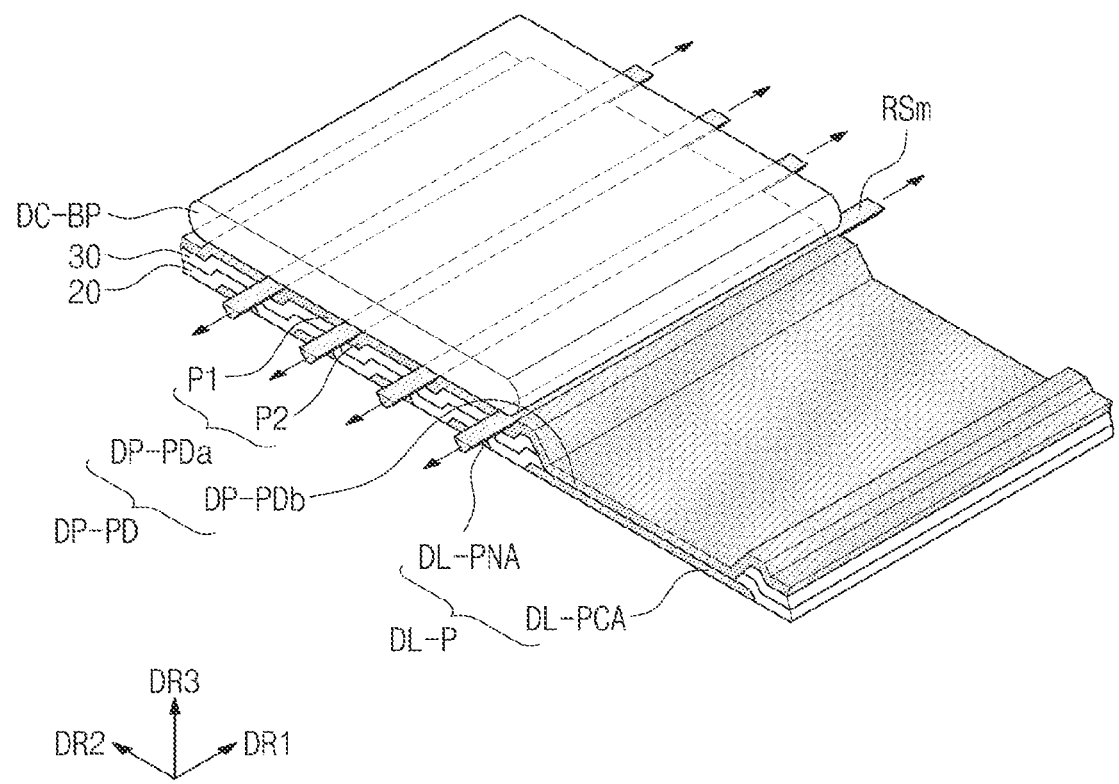
FIG. 14c is a perspective view of the display device according to an embodiment of the present invention.
Figure 14D:
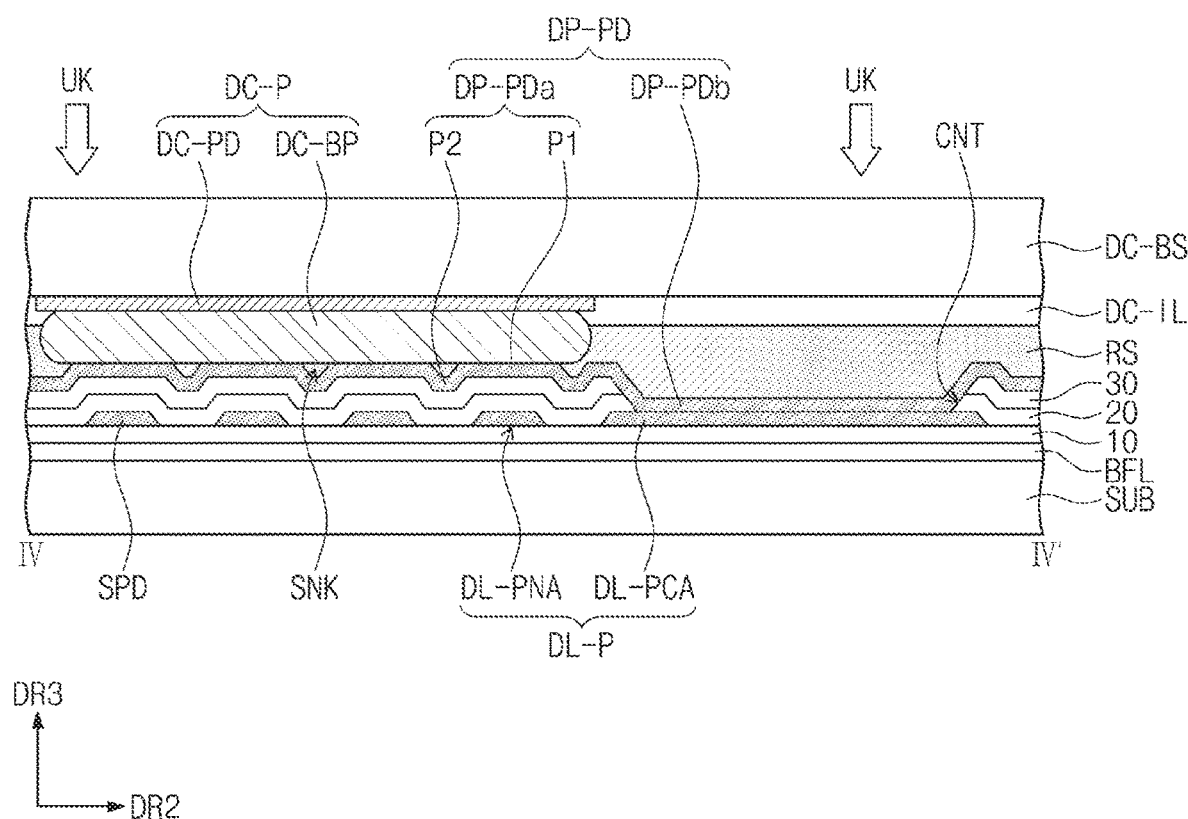
FIG. 14d is a cross-sectional view illustrating a method for manufacturing a display device according to an embodiment of the present invention.

FIG. 14a is a cross-sectional view illustrating the method for manufacturing the display device according to an embodiment of the present invention. FIG. 14b is an exploded perspective view of a display device according to an embodiment of the present invention. FIG. 14c is a perspective view of the display device according to an embodiment of the present invention. FIG. 14d is a cross-sectional view illustrating a method for manufacturing a display device according to an embodiment of the present invention.

Referring to FIGS. 14a and 14b, a heat/pressure mechanism PS is disposed on an electronic component DC to apply a pressure and heat HTK to an electronic component DC. Viscosity properties of a filler RS may be changed through the heat HTK and pressure, which are transferred from the heat/pressure mechanism PS. Also, ultrasonography bonding between a bump DC-BP and a first connection pad part DP-PDa may be performed through the heat HTK and pressure, which are transferred from the heat/pressure mechanism PS.

Since heat is applied to the filler RS through the heat/pressure mechanism PS, the filler RS is provided in a film type. As a result, the filler RS is disposed between a first portion P1 and the bump DC-BP of the first connection pad part DP-PDa. That is, the filler RS may not be in contact with the second portion P2.

As illustrated in FIG. 14b, before the ultrasonography bonding, the filler RS may be directly disposed on the first portion P1. Also, an inner space SNK defined by the first portion P1, the second portion P2, and the bump DC-BP described above may have a shape extending in the first direction DR1.

Particularly, referring to FIG. 14c, heat is applied to the filler RS through the heat/pressure mechanism PS, and a pressure is applied to the bump DC-BP through the heat/pressure mechanism PS. This may proceed during the first period described with reference to FIG. 13.

During the first period, as the bump DC-BP is in contact with the first portion P1 by an external pressure, the first filling portion between the bump DC-BP and the first portion P1 may move to the inner space SNK. As a result, the second portion P2 and the second filling portion disposed on the bump DC-BP may move in the first direction DR1. As illustrated in FIG. 14c, a filler RSm moving along the first direction DR1 may not overlap the bump DC-BP.

Although not shown in FIG. 14c, the filler RS may be disposed on the second connection pad part DP-PDb.

Thereafter, referring to FIG. 14d, ultrasonic vibration UK may be applied to an interface between the first portion P1 and the bump DC-BP. The ultrasonic vibration UK applied to the interface between the first portion P1 and the bump DC-BP may proceed during at least one period of the first period illustrated in FIG. 13 and may also proceed in the second period.

As described above, embodiments of the present invention are disclosed in the drawings and the specification. While specific terms were used, they were not used to limit the meaning or the scope of the present invention described in the claims, but merely used to explain the present invention. Accordingly, a person having ordinary skill in the art will understand from the above that various modifications and other equivalent embodiments are also possible. Hence, the real protective scope of the present invention shall be determined by the technical scope of the accompanying claims.

The technology for bonding the electronic component to the display panel using the ultrasonography bonding may improve the connection reliability between the electronic component and the display panel. Therefore, the present invention for bonding the electronic component to the display panel through the ultrasonography bonding has high industrial applicability.

The invention claimed is:

1. A display device, comprising:
   a display substrate comprising a display area and a non-display area adjacent to the display area;
   a signal pad part overlapping the non-display area and comprising a first signal pad part and a second signal pad part,
   wherein the second signal pad part faces the first signal pad part in one direction and is spaced apart from the first signal pad part on a plane;
   an insulating layer covering the signal pad part and disposed on the display substrate;
   a connection pad part disposed on the insulating layer and comprising a first connection pad part overlapping the first signal pad part and a second connection pad part,
   wherein the second connection pad part is electrically connected to the first connection pad part and is in electrical contact with the second signal pad part through a contact hole defined in the insulating layer;
   an electronic component comprising a bump that is in electrical contact with the first connection pad part,
   wherein the first signal pad part comprises a plurality of signal pad portions spaced apart from each other on the plane,
   wherein the first connection pad part comprises first portions and second portions, which are alternately and repeatedly disposed along the one direction,
   wherein the first portions of the first connection pad part overlap the signal pad portions, respectively, and the second portions of the first connection pad part do not overlap the first signal pad part,
   wherein the second portions are recessed in a direction away from the first portions toward the display substrate and form a stepped portion between the first portions and the second portions; and
   a filler disposed between the electronic component and the connection pad part,
   wherein the filler is in contact with each of the second portions, and is not in contact with each of the first portions.

2. The display device of claim 1, wherein each of the first portions is in contact with the bump, and each of the second portions is not in contact with the bump.

3. The display device of claim 2, wherein the filler is disposed in an inner space defined by the first portions, the second portions, and the bump, and
   the inner space is connected to a space between the electronic component and the first connection pad part, which do not overlap the bump.

4. The display device of claim 1, wherein the filler overlaps the insulating layer.

5. The display device of claim 1, wherein each of the signal pad portions is arranged in the one direction, and extends in another direction that is perpendicular to the one direction.

6. The display device of claim 5, wherein only one of the signal pad portions directly faces the second signal pad part in the one direction.

7. The display device of claim 5, wherein the signal pad part further comprises:
   a third signal pad part that is electrically connected to the signal pad portions and the second signal pad part,
   wherein the third signal pad part comprises first sub pad portions disposed between the signal pad portions and a second sub pad portion connecting one of the signal pad portions to the second signal pad part, and
   the first signal pad part and the third signal pad part are provided in an integrated shape.

8. The display device of claim 1, wherein each of the signal pad portions extends in the one direction, and the signal pad portions are arranged in another direction that is perpendicular to the one direction.

9. The display device of claim 8, wherein each of the signal pad portions faces the second signal pad part in the one direction.

10. The display device of claim 1, wherein the first signal pad part and the second signal pad part are electrically insulated from each other.

11. The display device of claim 1, wherein the insulating layer comprises a plurality of sub insulating layers, and
    the contact hole passes through the sub insulating layers, and the second connection pad part is in electrical contact with the second signal pad part through the contact hole.

12. The display device of claim 1, wherein the contact hole does not overlap the first connection pad part on the plane.

13. The display device of claim 1, wherein the bump comprises a first bump portion overlapping the first connection pad part and a second bump portion that does not overlap the first connection pad part, and
    the second bump portion is in contact with a portion of the insulating layer.

14. The display device of claim 13, wherein a planar area of the second bump portion is about 10% to about 50% of a total planar area of the bump.

15. The display device of claim 1, wherein each of the first portions is flat.

* * * * *